United States Patent
Akiyama

(10) Patent No.: US 10,312,281 B2
(45) Date of Patent: Jun. 4, 2019

(54) SOLID-STATE IMAGE PICKUP UNIT, METHOD OF MANUFACTURING SOLID-STATE IMAGE PICKUP UNIT, AND ELECTRONIC APPARATUS

(71) Applicant: Sony Corporation, Tokyo (JP)

(72) Inventor: Kentaro Akiyama, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 15/411,470

(22) Filed: Jan. 20, 2017

(65) Prior Publication Data

US 2017/0133424 A1   May 11, 2017

Related U.S. Application Data

(63) Continuation of application No. 15/087,729, filed on Mar. 31, 2016, now Pat. No. 9,576,998, which is a (Continued)

(30) Foreign Application Priority Data

Oct. 4, 2011  (JP) ................ 2011-220310
Oct. 11, 2011 (JP) ................ 2011-223613

(51) Int. Cl.
*H01L 31/062* (2012.01)
*H01L 27/146* (2006.01)
(Continued)

(52) U.S. Cl.
CPC .. *H01L 27/14634* (2013.01); *H01L 21/76898* (2013.01); *H01L 23/481* (2013.01);
(Continued)

(58) Field of Classification Search
None
See application file for complete search history.

(56) References Cited

U.S. PATENT DOCUMENTS 9,184,205 B2 * 11/2015 Akiyama .......... H01L 27/14632
9,374,511 B2 *  6/2016 Akiyama .......... H01L 27/14632
(Continued)

FOREIGN PATENT DOCUMENTS

JP   2001-351920    12/2001
JP   2006-261638     9/2006
(Continued)

OTHER PUBLICATIONS

Summons to Attend Oral Proceedings for European Patent Application No. 12838953.3, dated Jan. 4, 2019, 11 pages.
(Continued)

*Primary Examiner* — Hung K Vu
(74) *Attorney, Agent, or Firm* — Sheridan Ross P.C.

(57) ABSTRACT

A back-illuminated type solid-state image pickup unit in which a pad wiring line is provided on a light reception surface and which is capable of improving light reception characteristics in a photoelectric conversion section by having a thinner insulating film in a pixel region. The solid-state image pickup unit includes a sensor substrate having a pixel region in which photoelectric conversion sections are formed in an array, and a drive circuit is provided on a surface opposed to a light reception surface for the photoelectric conversion sections of the sensor substrate. A through hole via reaching the drive circuit from the light reception surface of the sensor substrate is provided in a peripheral region located outside the pixel region. A pad wiring line directly laminated on the through hole via is provided on the light reception surface in the peripheral region.

30 Claims, 20 Drawing Sheets

Related U.S. Application Data continuation of application No. 14/871,345, filed on Sep. 30, 2015, now Pat. No. 9,374,511, which is a continuation of application No. 14/346,607, filed as application No. PCT/JP2012/074945 on Sep. 27, 2012, now Pat. No. 9,184,205.

(51) Int. Cl.

| | | |
|---|---|---|
| H04N 5/225 | (2006.01) | |
| H04N 5/374 | (2011.01) | |
| H01L 21/768 | (2006.01) | |
| H01L 23/48 | (2006.01) | |

(52) U.S. Cl.
CPC ...... *H01L 27/1463* (2013.01); *H01L 27/1464* (2013.01); *H01L 27/1469* (2013.01); *H01L 27/14612* (2013.01); *H01L 27/14623* (2013.01); *H01L 27/14627* (2013.01); *H01L 27/14632* (2013.01); *H01L 27/14636* (2013.01); *H01L 27/14643* (2013.01); *H01L 27/14683* (2013.01); *H04N 5/225* (2013.01); *H04N 5/3741* (2013.01)

(56) References Cited

U.S. PATENT DOCUMENTS

| 9,576,998 B2 * | 2/2017 | Akiyama .......... H01L 27/14632 |
|---|---|---|
| 2011/0049336 A1 | 3/2011 | Matsunuma |

FOREIGN PATENT DOCUMENTS

| JP | 2010-199602 | 9/2010 |
|---|---|---|
| KR | 10-2010-0105380 | 6/2014 |

OTHER PUBLICATIONS

Official Action (with English translation) for Korean Patent Application No. 10-2014-7006318, dated Mar. 6, 2019, 13 pages.

\* cited by examiner

[FIG. 1]
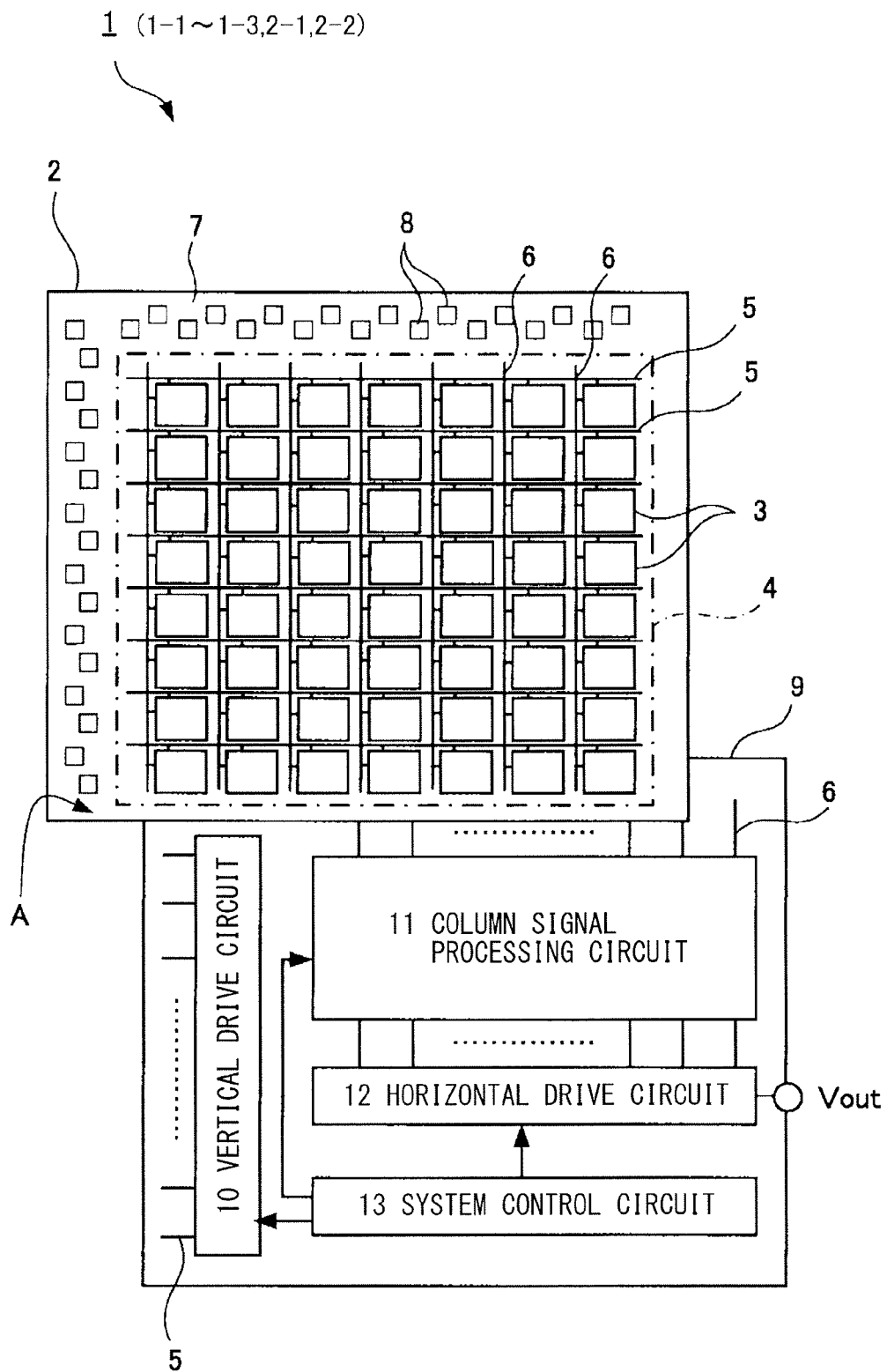

[FIG. 2]
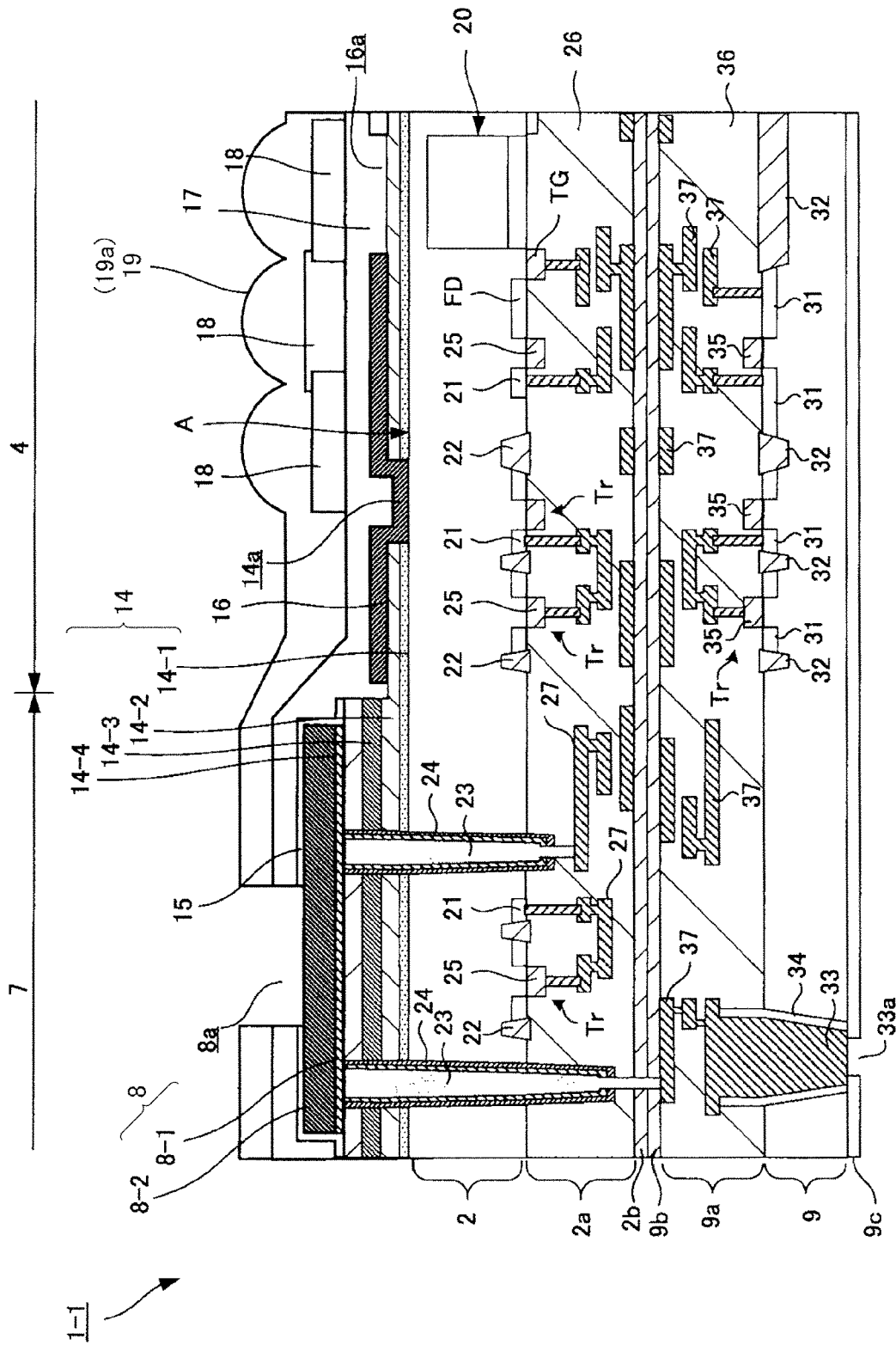

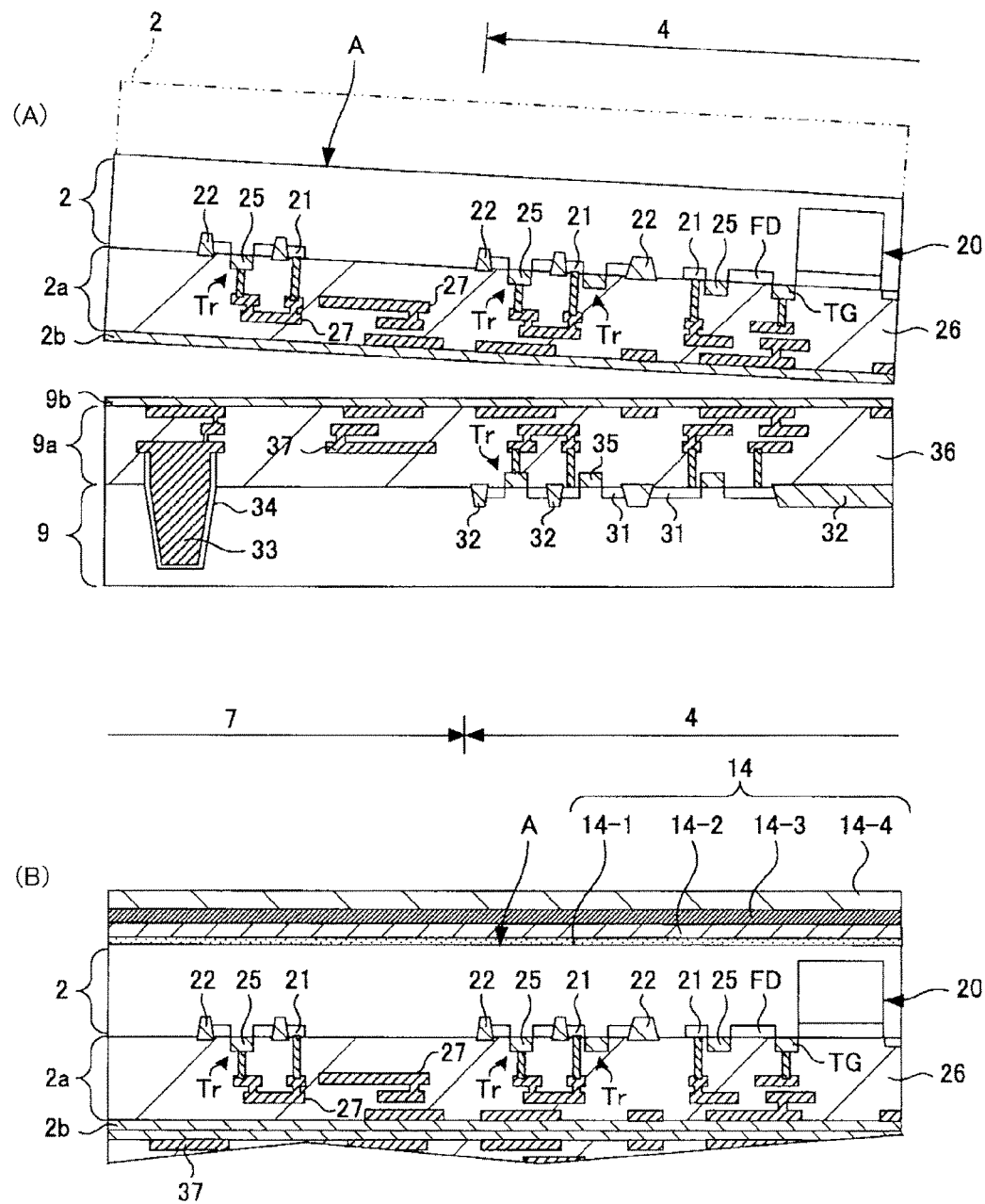
[FIG. 3]

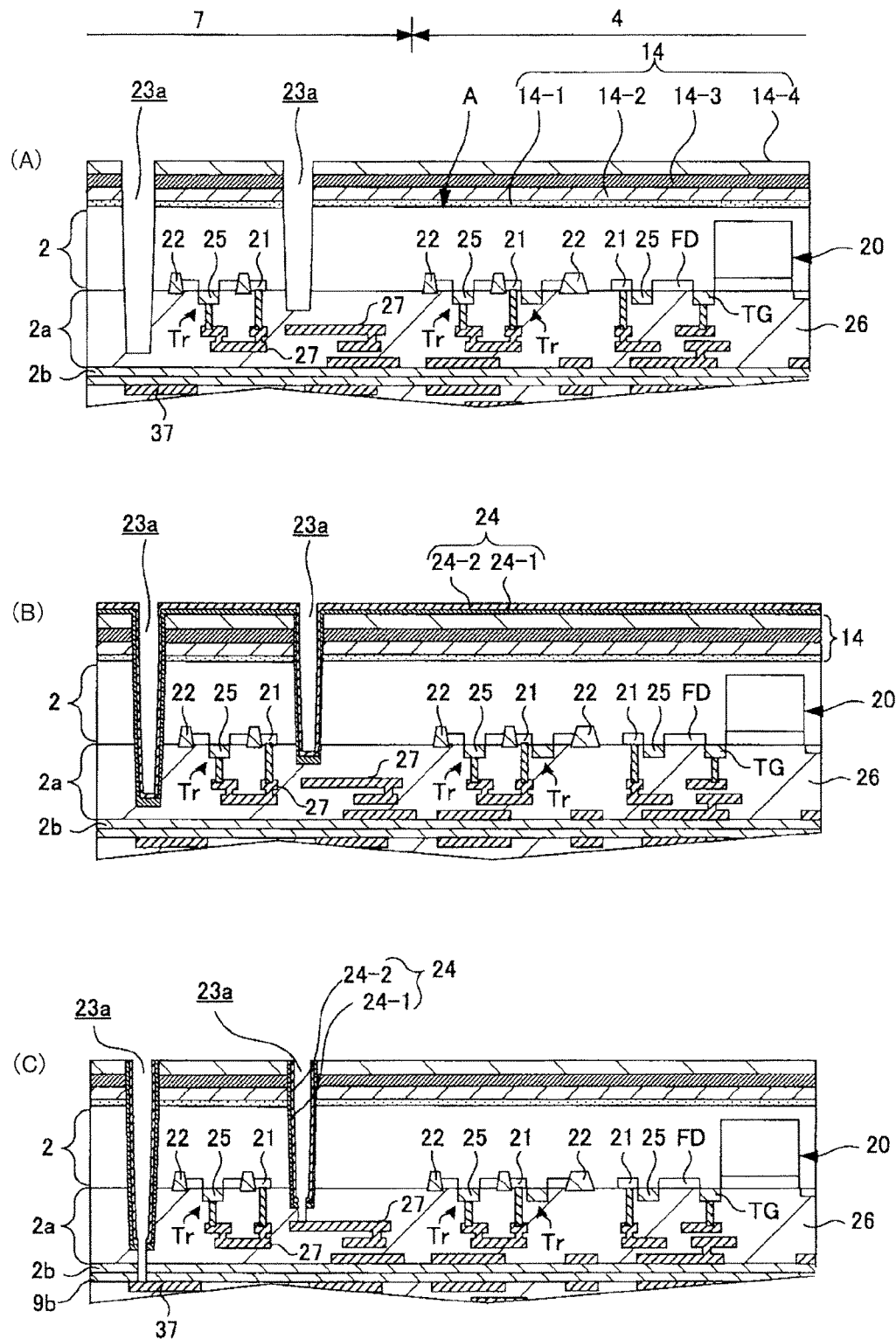
[FIG. 4]

[FIG. 5]
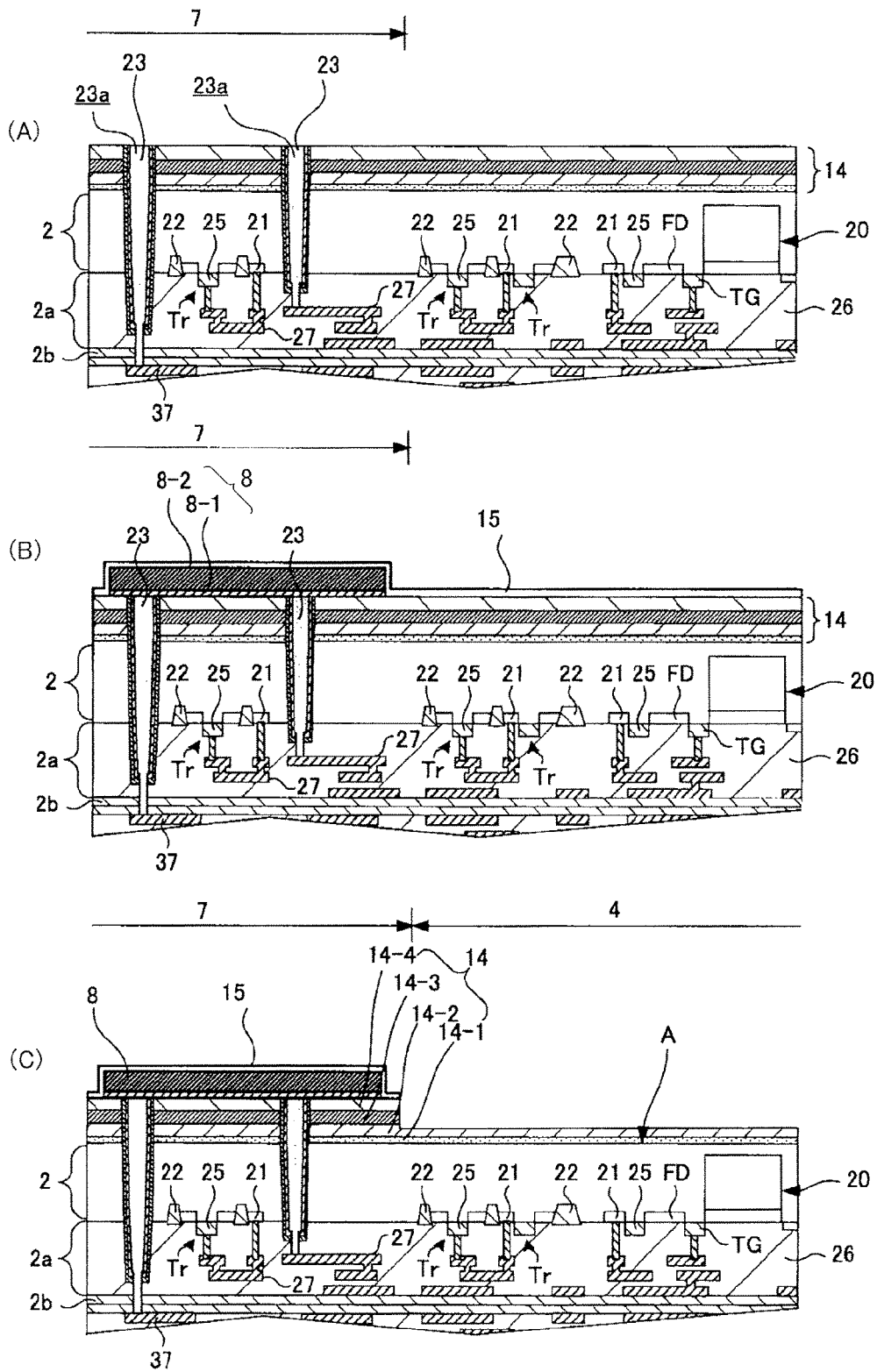

[ FIG. 6 ]
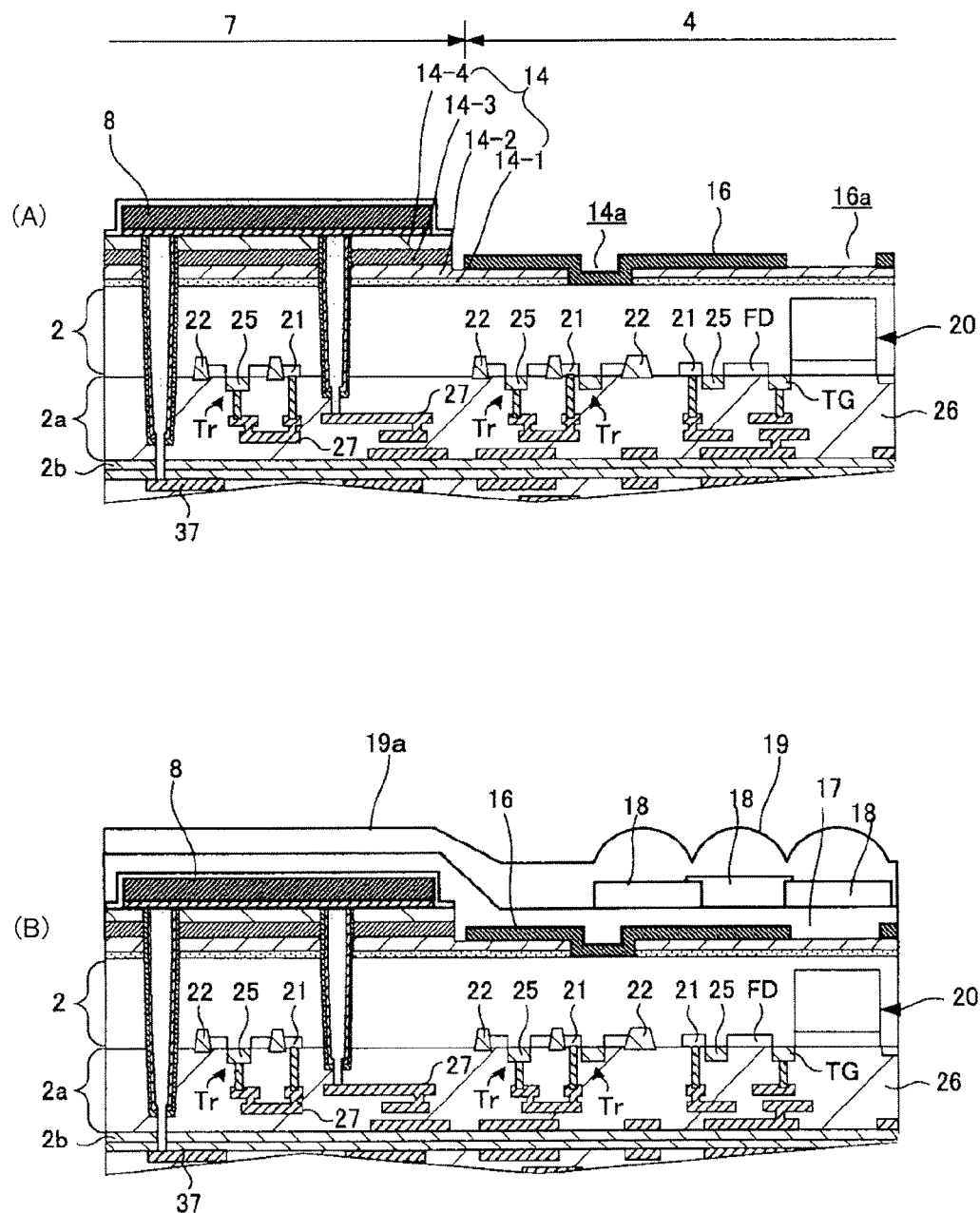

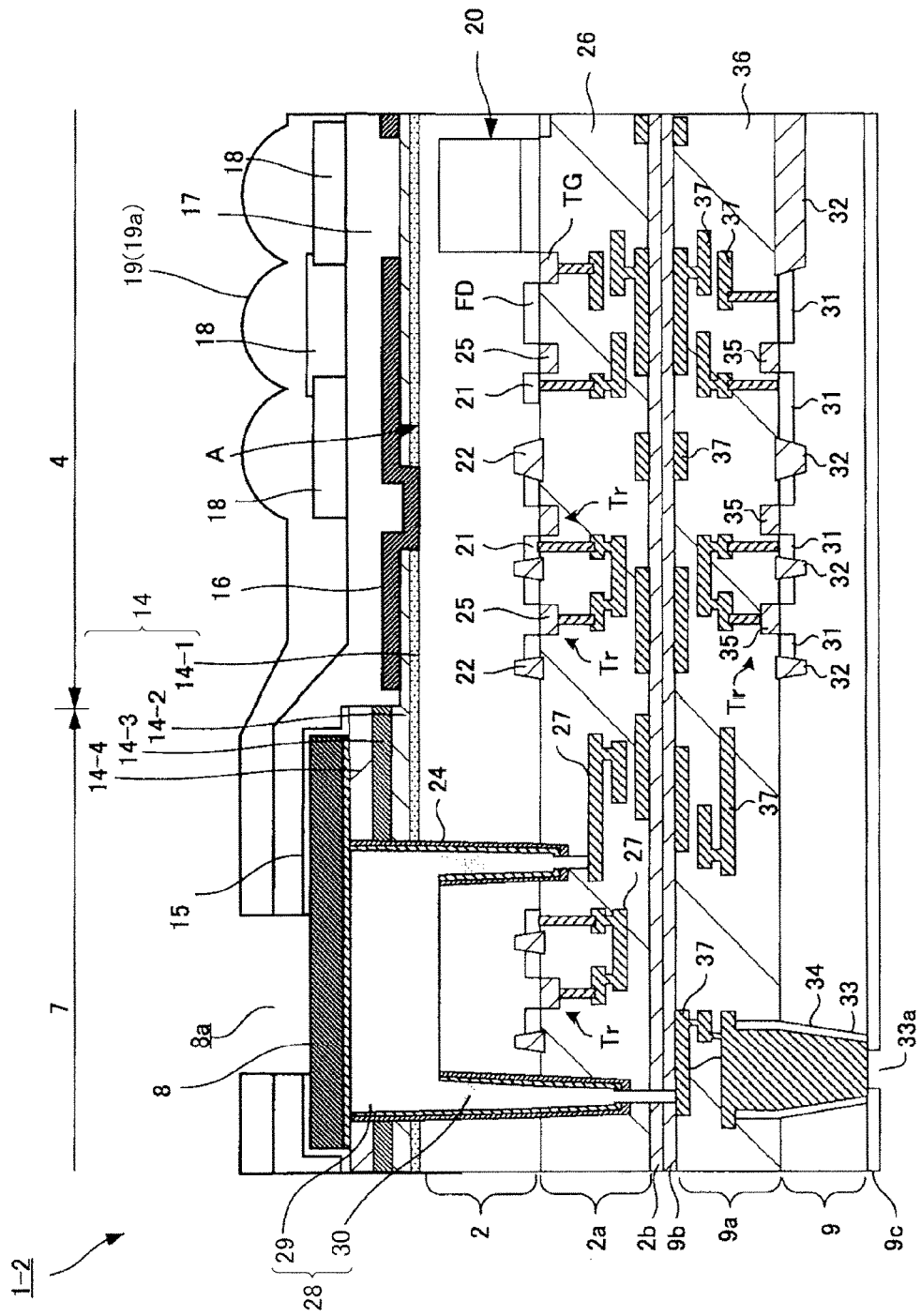
[FIG. 7]

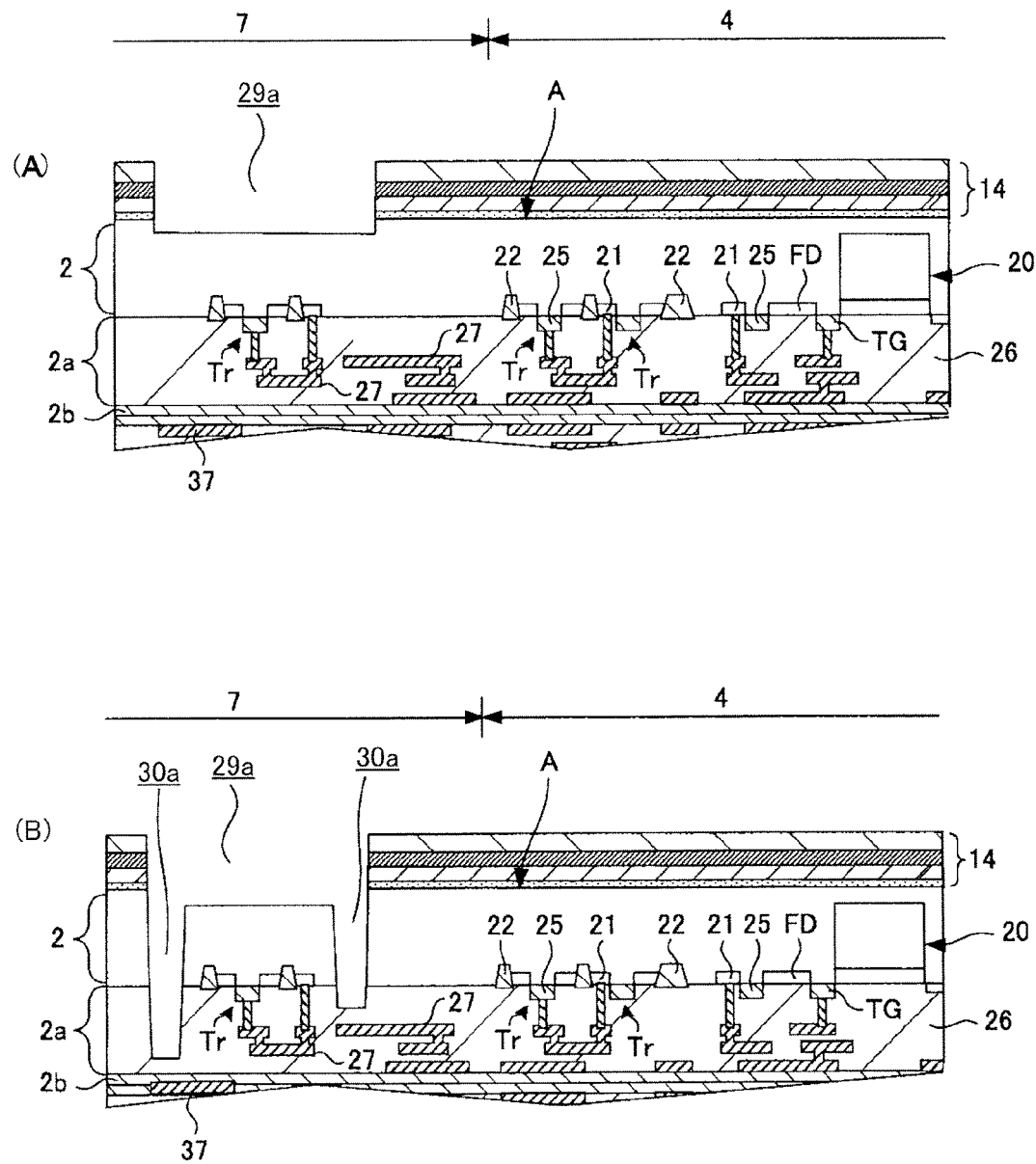
[ FIG. 8 ]

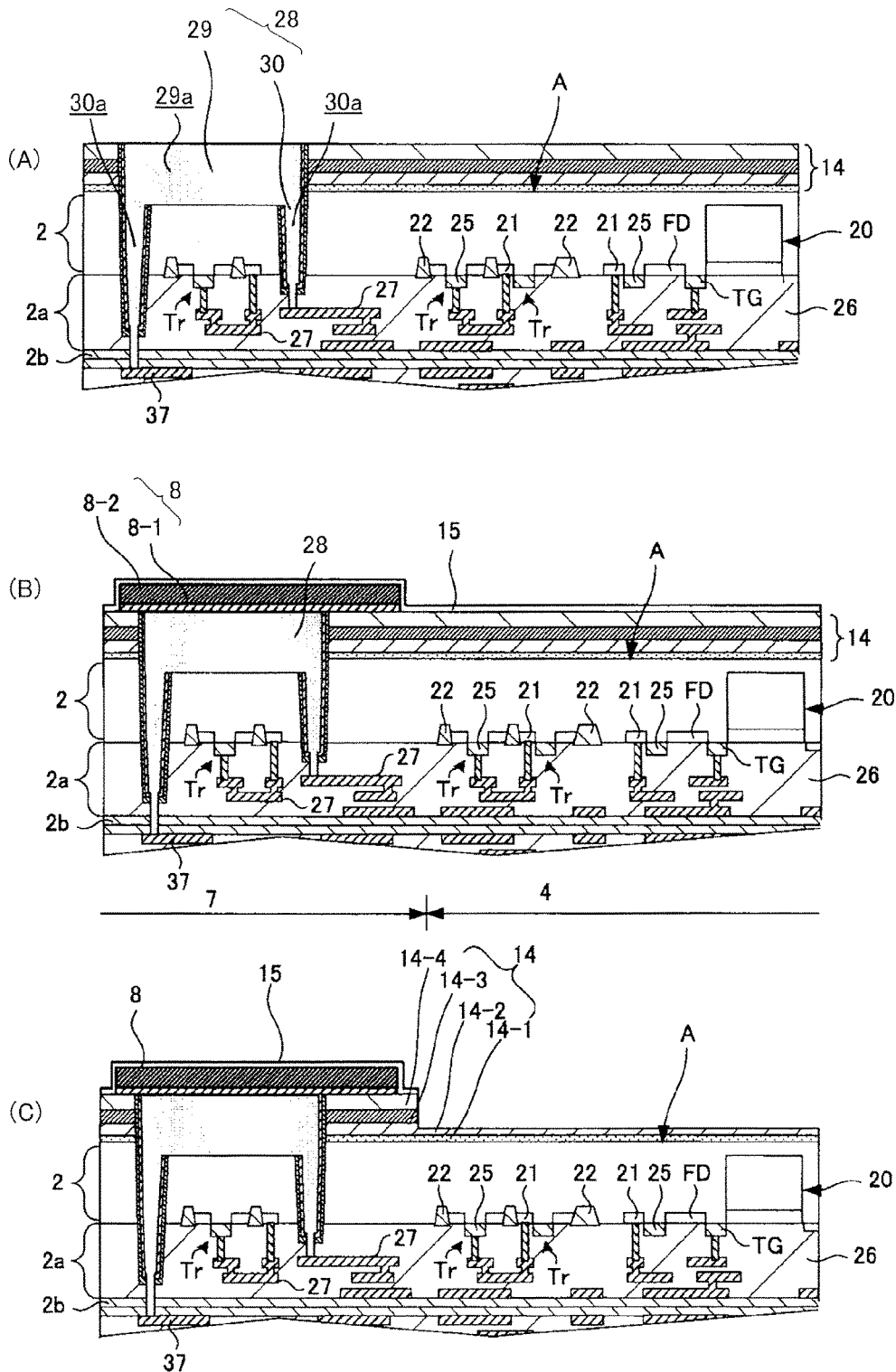
[FIG.9]

[ FIG. 10 ]
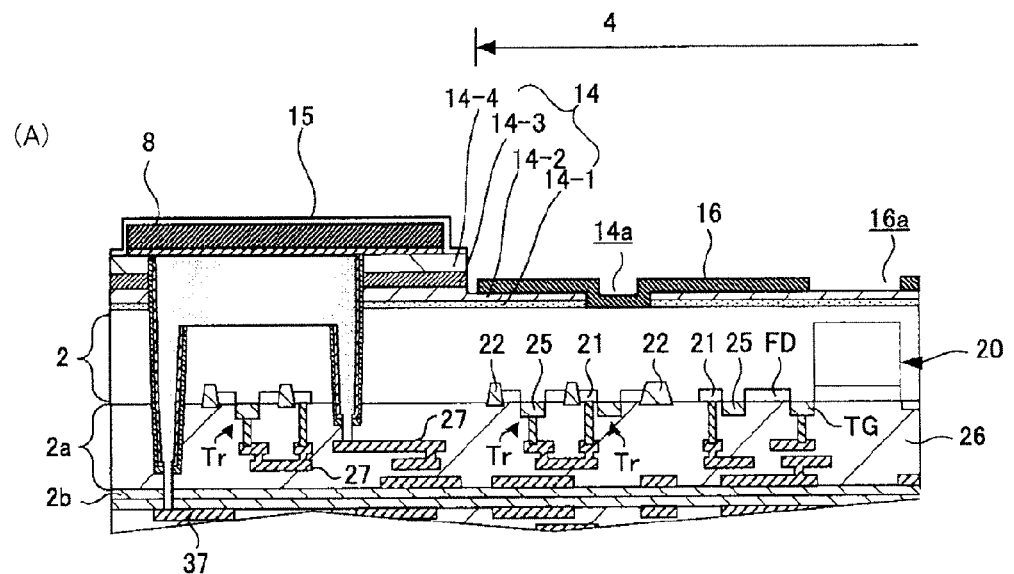
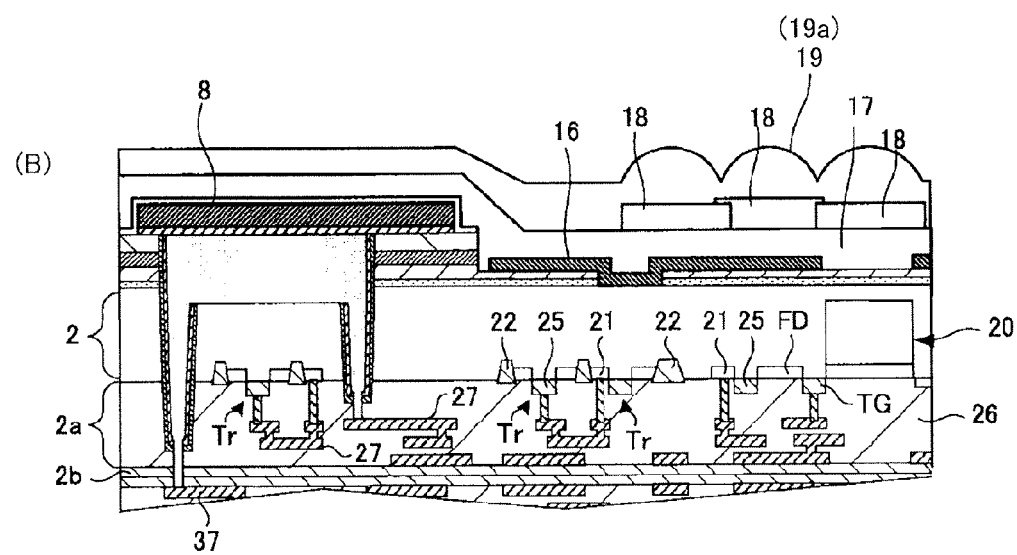

[ FIG. 11 ]
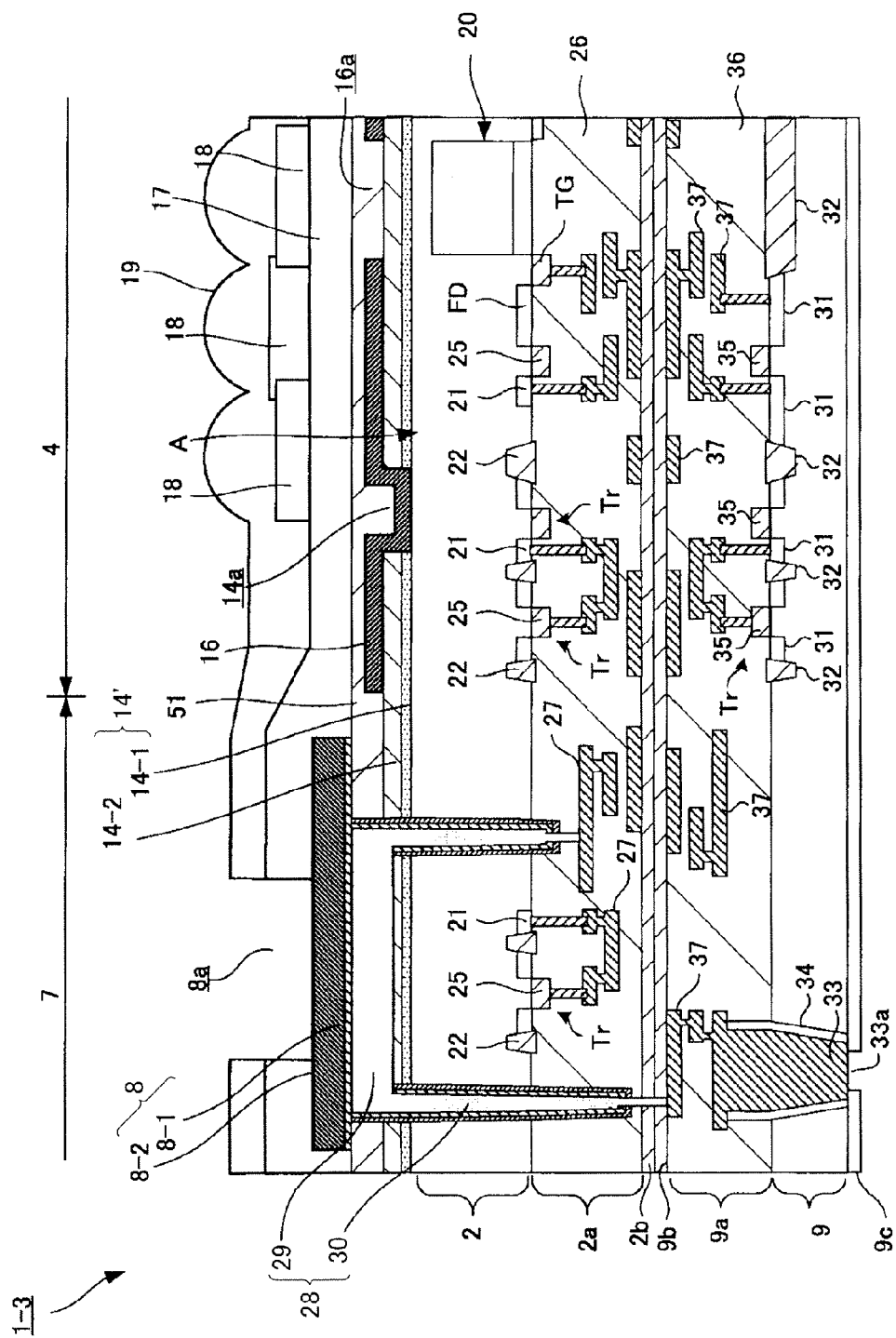

[ FIG. 12 ]
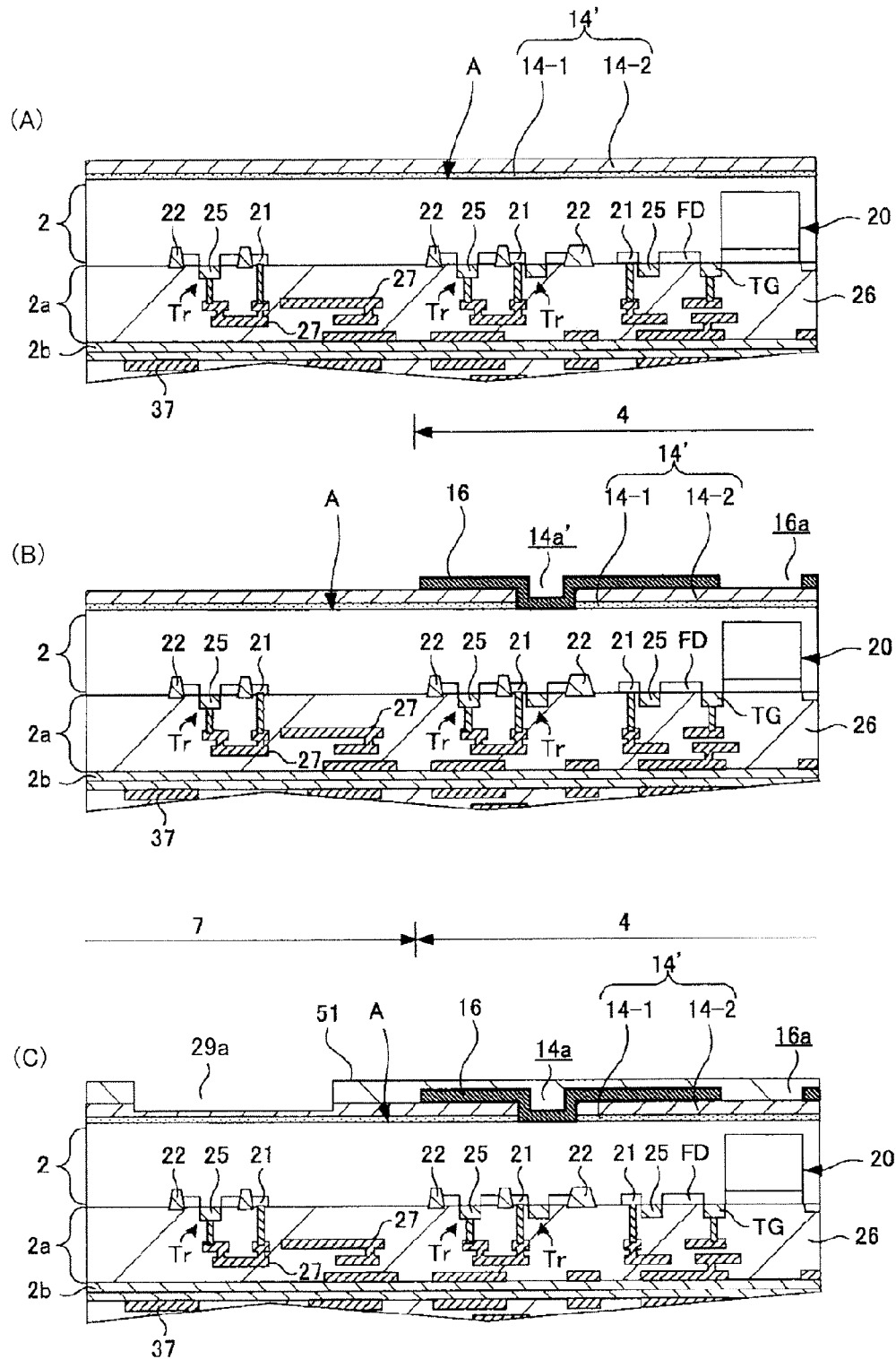

[ FIG. 13 ]
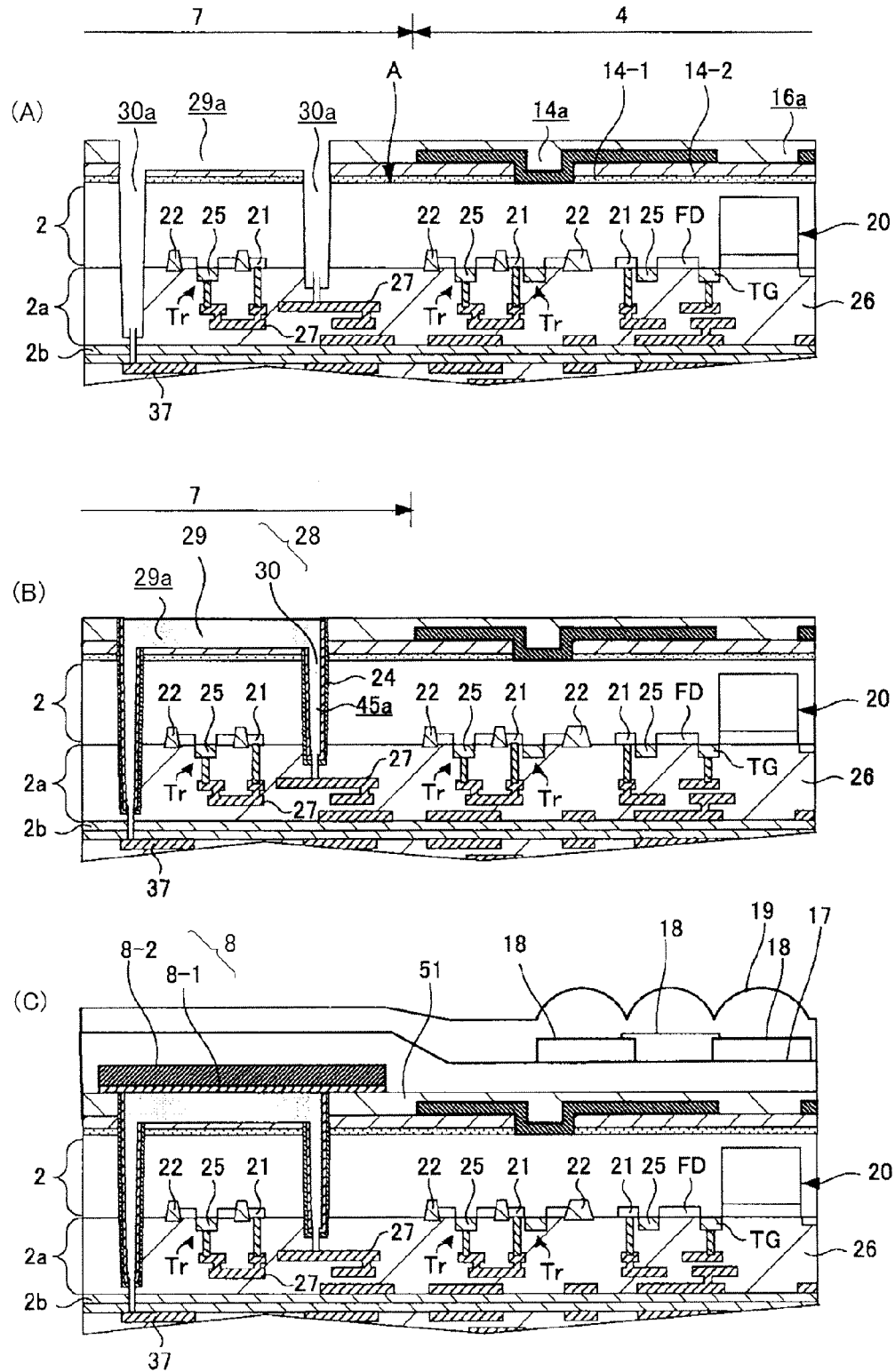

[FIG. 14]
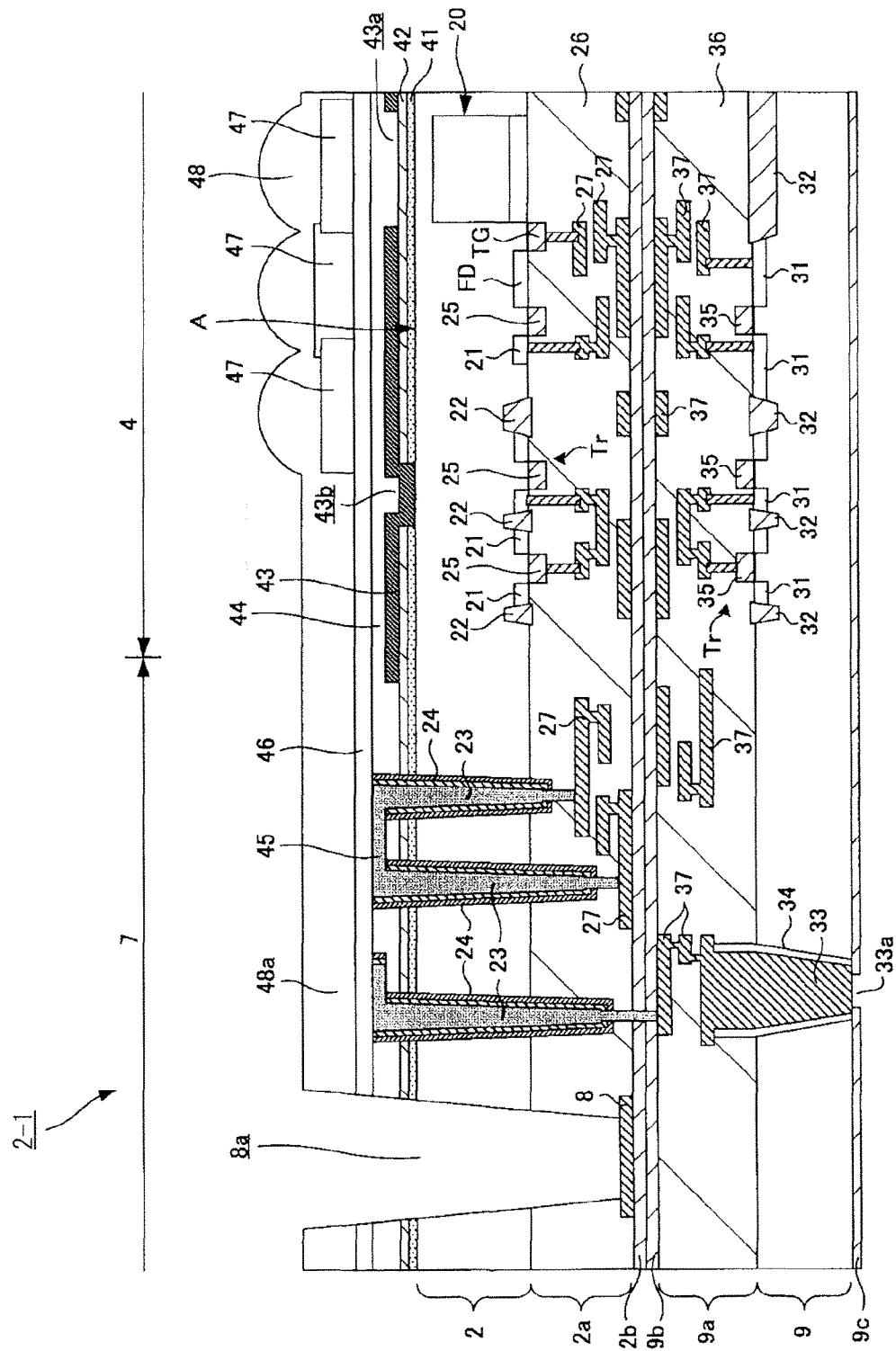

[FIG. 15]
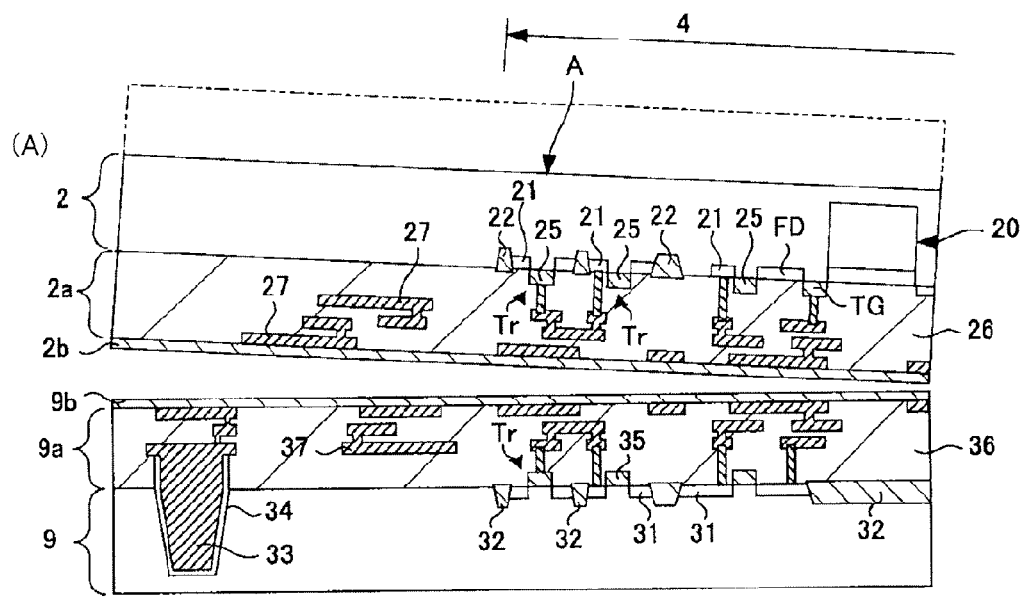
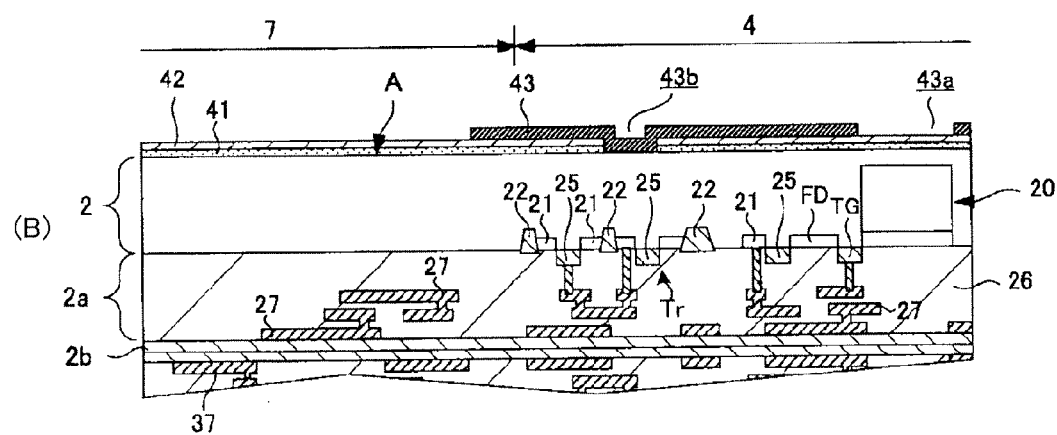

[ FIG. 16 ]
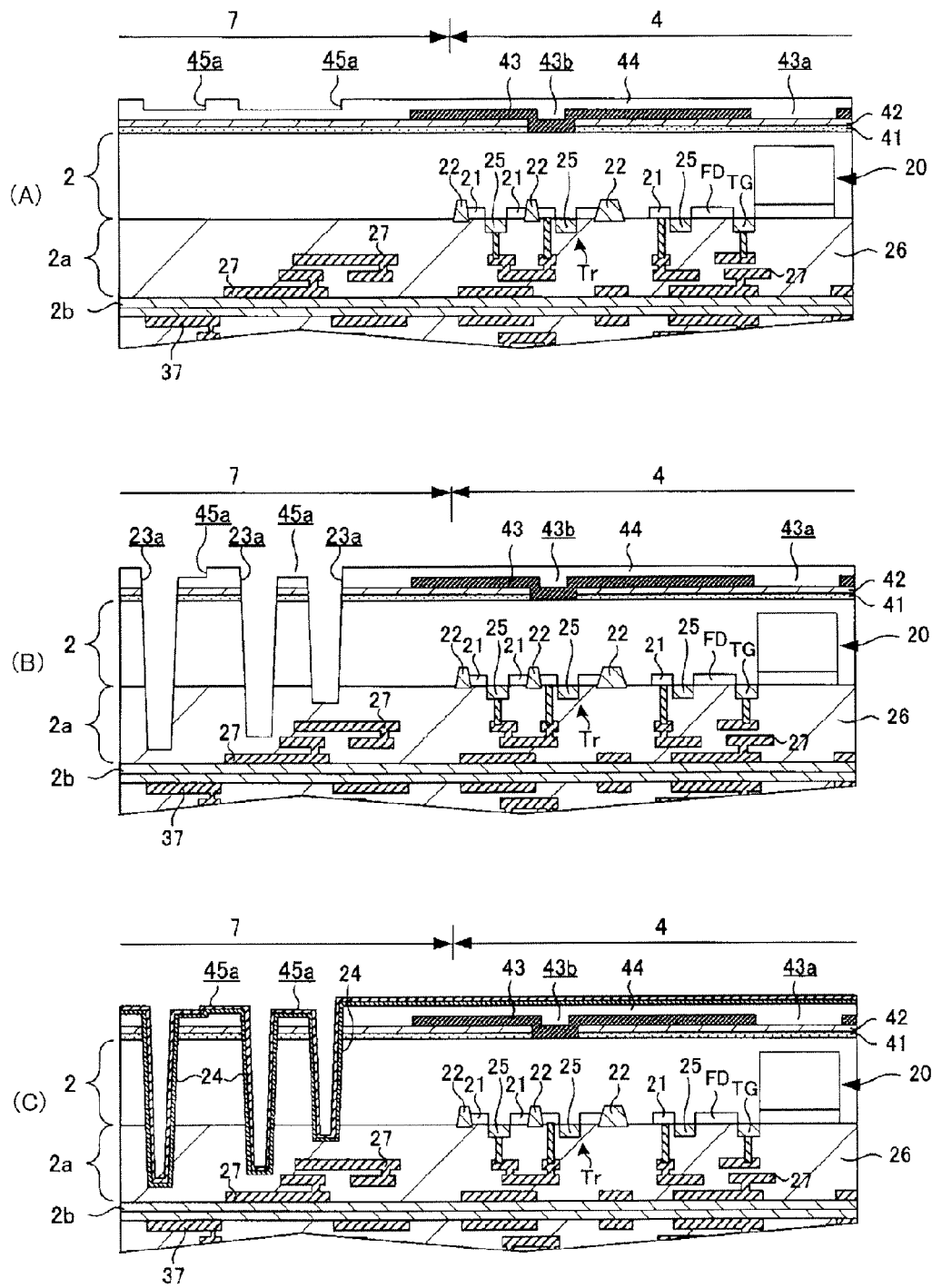

[ FIG. 17 ]
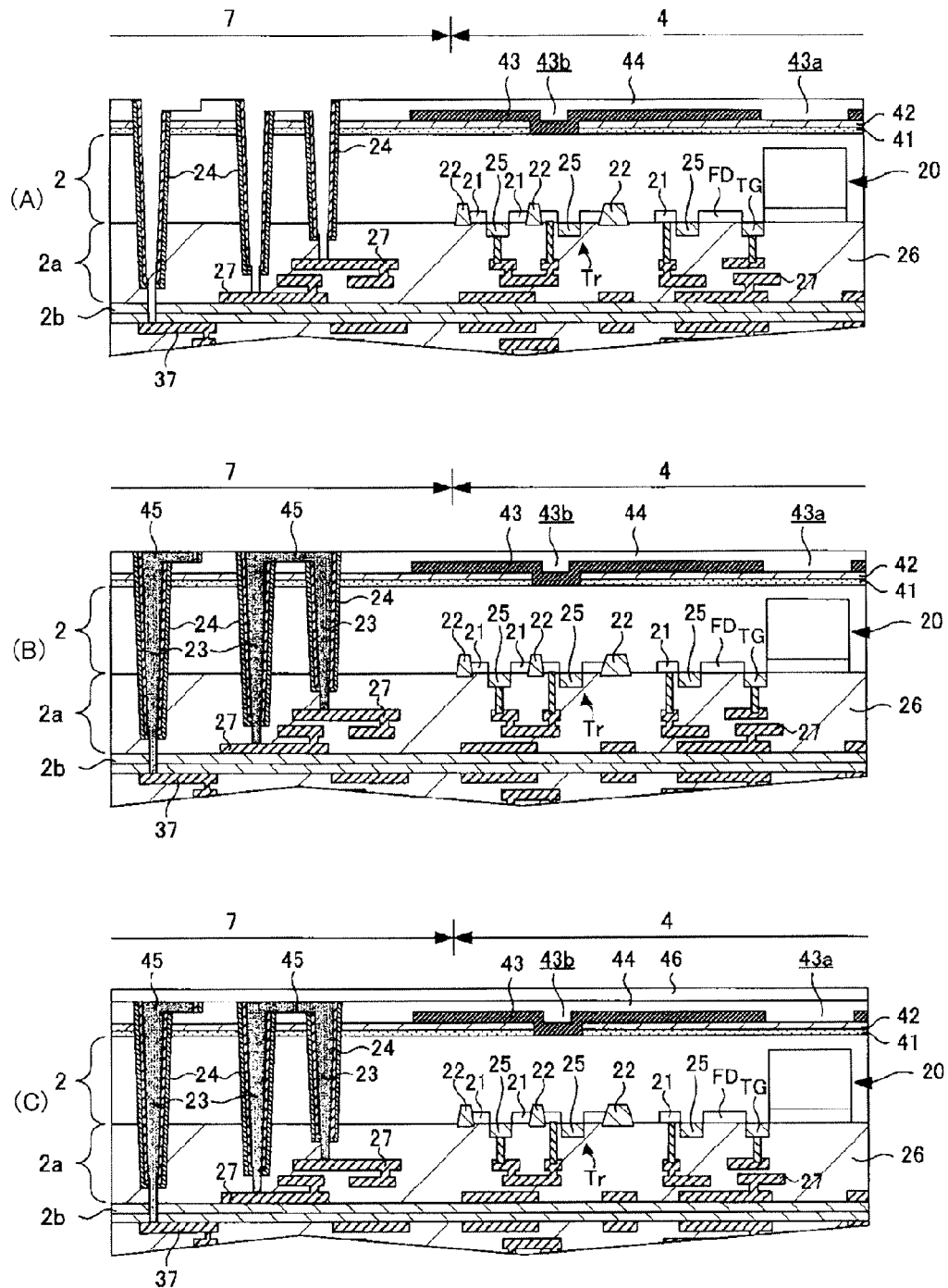

[FIG. 18]
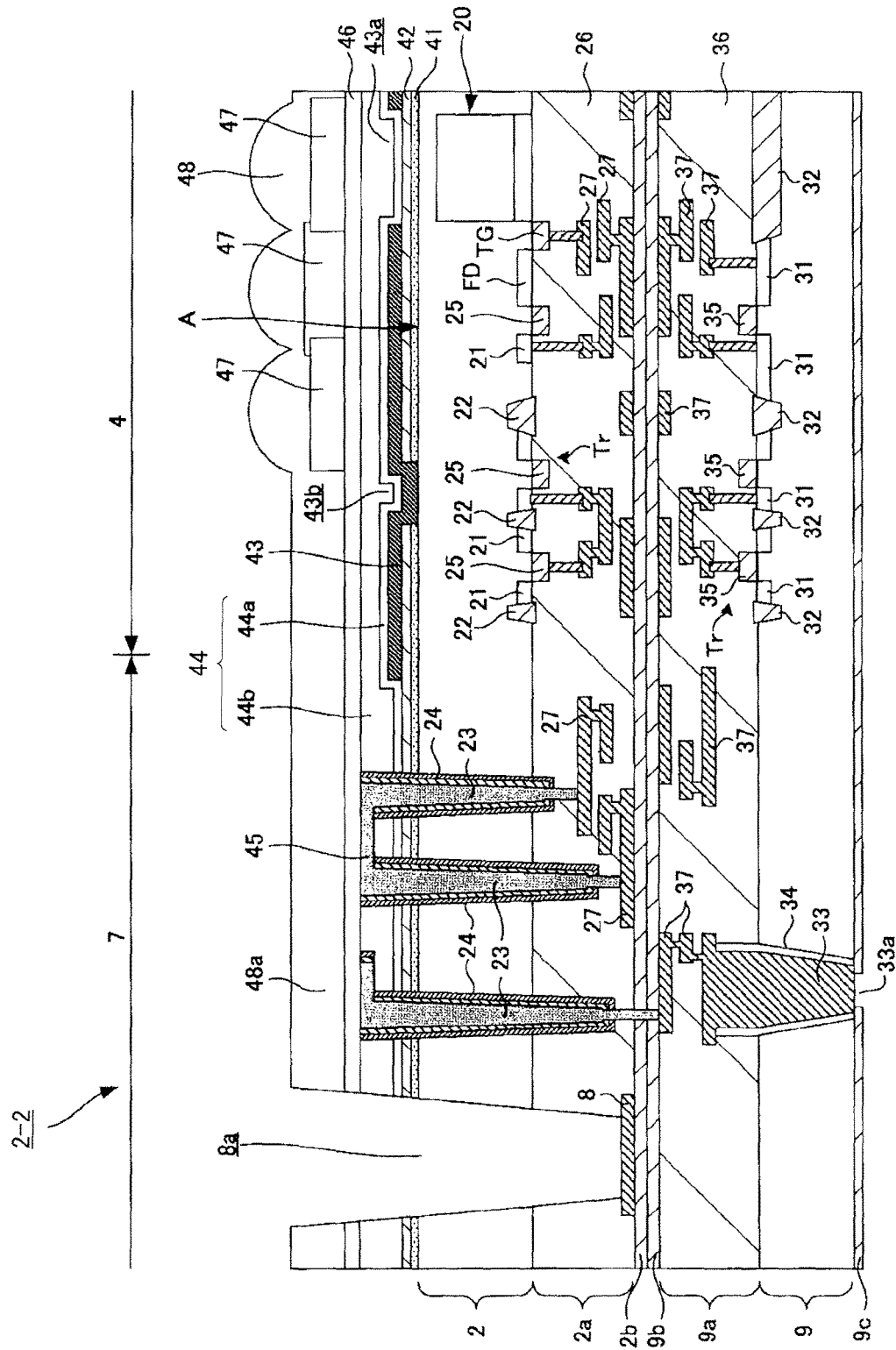

[ FIG. 19 ]
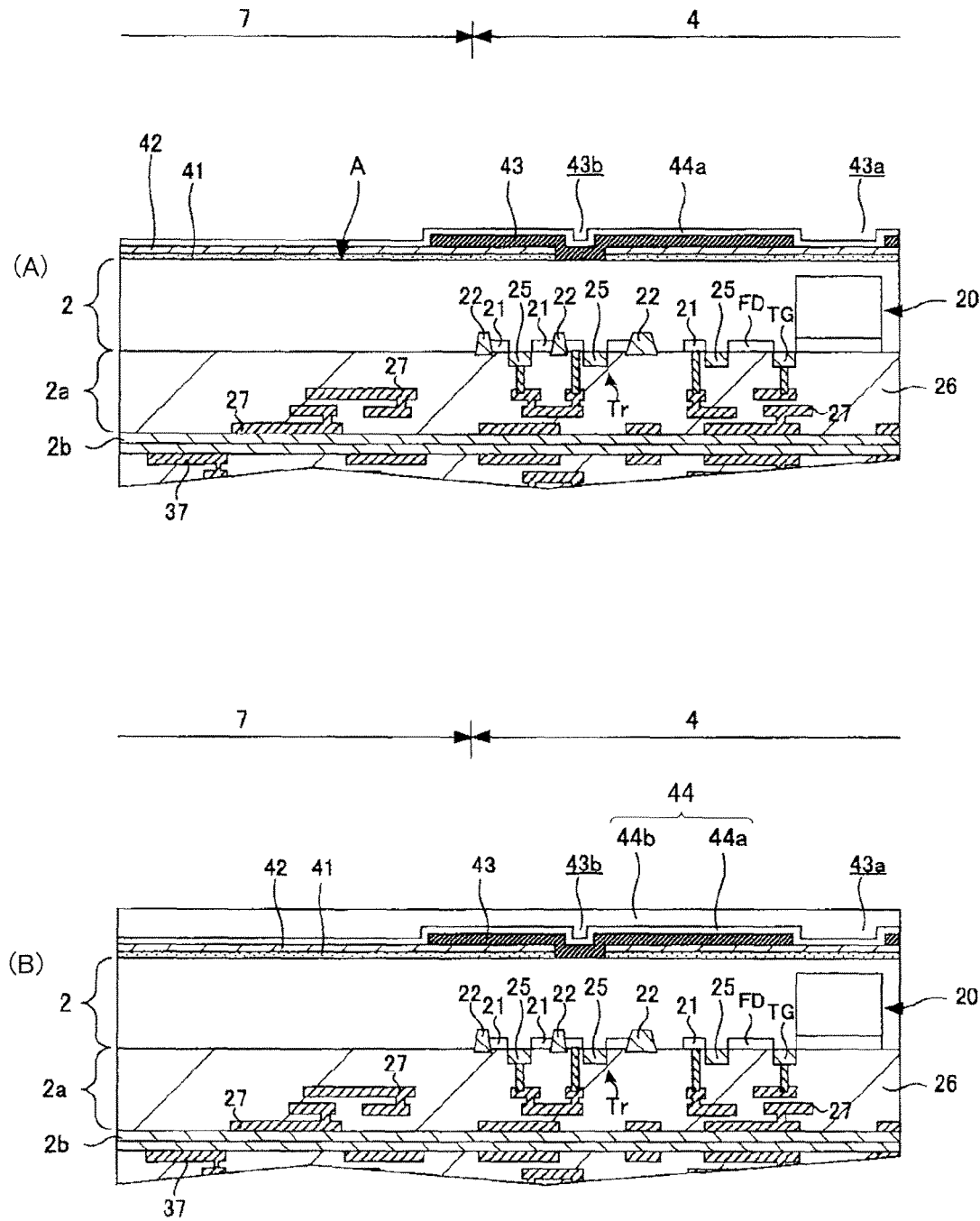

[ FIG. 20 ]
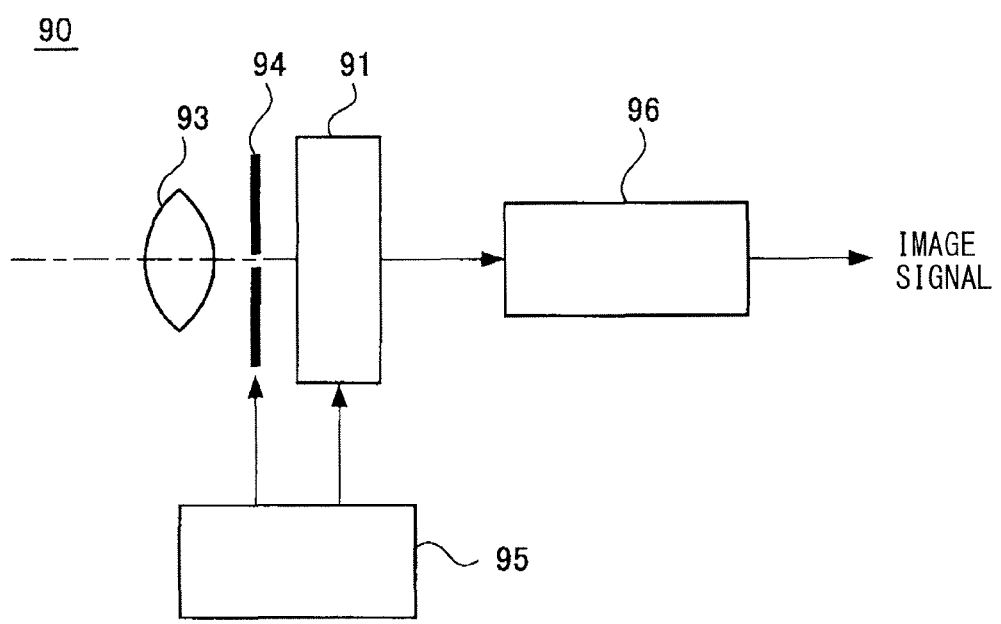

SOLID-STATE IMAGE PICKUP UNIT, METHOD OF MANUFACTURING SOLID-STATE IMAGE PICKUP UNIT, AND ELECTRONIC APPARATUS

RELATED APPLICATION DATA

This application is a continuation of U.S. patent application Ser. No. 15/087,729 filed on Mar. 31, 2016, which is a continuation of U.S. patent application Ser. No. 14/871,345 filed on Sep. 30, 2015, now U.S. Pat. No. 9,374,511, which is a continuation of U.S. patent application Ser. No. 14/346,607 filed Mar. 21, 2014, now U.S. Pat. No. 9,184,205, which is the Section 371 National Stage of PCT/JP2012/074945 filed on Sep. 27, 2012, the entireties of which are incorporated herein by reference to the extent permitted by law. The present application claims the benefit of priority to Japanese Patent Application Nos. JP 2011-220310 filed on Oct. 4, 2011 in the Japan Patent Office and JP 2011-223613 filed on Oct. 11, 2011, the entireties of which are incorporated by reference herein to the extent permitted by law.

TECHNICAL FIELD

The present technology relates to a solid-state image pickup unit, a method of manufacturing a solid-state image pickup unit, and an electronic apparatus, and specifically relates to a solid-state image pickup unit including a drive circuit on a surface opposed to a light reception surface of a semiconductor substrate, a method of manufacturing the solid-state image pickup unit, and an electronic apparatus using the solid-state image pickup unit.

BACKGROUND ART

In solid-state image pickup units, to improve photoelectric conversion efficiency and sensitivity with respect to incident light, there has been proposed a so-called back-illuminated type structure in which a drive circuit is formed on a front surface of a semiconductor substrate and a back surface of the semiconductor substrate serves as a light reception surface. Moreover, there has been proposed a three-dimensional structure in which a circuit substrate where a drive circuit is formed is prepared in addition to a semiconductor substrate where a photoelectric conversion section is formed and the circuit substrate is bonded to a surface opposed to a light reception surface of the semiconductor substrate.

In such a back-illuminated type solid-state image pickup unit, a plurality of through hole vias reaching a drive circuit of a semiconductor substrate or a drive circuit of a circuit substrate are provided to a peripheral region located outside a pixel region including a photoelectric conversion section so as to penetrate the semiconductor substrate. A configuration on the light reception surface of the semiconductor is fabricated by the following processes. First, a cap film is provided on the light reception surface so as to cover the through hole vias that are so formed as to be embedded in the semiconductor substrate, and then a light-shielding film is provided on the cap film. Next, in the peripheral region provided with the through hole vias, a wiring line and an electrode pad allowing the through hole vias to be connected to one another are provided on the cap film. Then, a planarization film is provided so as to cover the wiring line and the electrode pad, and color filters and on-chip lenses corresponding to the respective photoelectric conversion sections are provided on the planarization film. Finally, in the peripheral region, the planarization film covering the wiring line and the electrode pad is selectively removed by etching to form a pad opening allowing the electrode pad to be exposed.

Moreover, a configuration on the light reception surface side of the back-illuminated type solid-state image pickup unit is as follows. A through hole via penetrating the semiconductor substrate is provided to a section peripheral to the pixel region where the photoelectric conversion sections are arrayed. The through hole via via is connected to a wiring line or a circuit substrate provided on a side opposed to the light reception surface. Moreover, a top on the light reception surface side is covered with an insulating film, and a pad wiring line such as a wiring line for connection or an electrode pad is provided on the insulating film. The pad wiring line is connected to the through hole via through a connection hole formed in the insulating film, and is connected to an external wiring line by wire bonding.

Further, an insulating film covering the pad wiring line is provided on the light reception surface side, and color filters and on-chip lenses corresponding to the respective photoelectric conversion sections are provided on the insulating film. Moreover, an opening allowing the pad wiring line to be exposed is provided to the insulating film covering the pad wiring line (refer to the following PTL 1 up to this point).

CITATION LIST

Patent Literature

[PTL 1] Japanese Unexamined Patent Application Publication No. 2010-245506 (for example, refer to FIG. 3, and paragraphs [0057] and [0062])

SUMMARY

However, in the above-described back-illuminated type solid-state image pickup unit, the pad wiring lines and the on-chip lenses are disposed above the light reception surface with a plurality of insulating films in between; therefore, a distance from the light reception surface to the on-chip lens is large, thereby causing deterioration in light reception characteristics in the photoelectric conversion sections. Moreover, in the back-illuminated type solid-state image pickup unit with such a configuration, the cap film covering the through hole vias is provided below the light-shielding film on the light reception surface. Therefore, a distance between the light reception surface and the light-shielding film is large, thereby easily causing color-mixing by oblique light incidence, and deteriorating the light reception characteristics in the photoelectric conversion sections.

Therefore, it is desirable to provide a back-illuminated type solid-state image pickup unit, in which a pad wiring line is provided on a light reception surface, capable of improving light reception characteristics in a photoelectric conversion section by thinning an insulating film in the back-illuminated type solid-state image pickup unit, a method of manufacturing the same, and an electronic apparatus. Moreover, it is desirable to provide a back-illuminated type solid-state image pickup unit capable of improving light reception characteristics in a photoelectric conversion section by reducing a distance between a light reception surface of a semiconductor substrate and a light-shielding film, a method of manufacturing the same, and an electronic apparatus.

A first solid-state image pickup unit according to an embodiment of the present technology includes a sensor substrate having a pixel region in which photoelectric conversion sections are formed in an array, and a drive circuit is provided on a surface opposed to a light reception surface for the photoelectric conversion sections of the sensor substrate. Moreover, a through hole via reaching the drive circuit from the light reception surface of the sensor substrate is provided in a peripheral region located outside the pixel region. Further, a pad wiring line directly laminated on the through hole via is provided on the light reception surface in the peripheral region.

The first solid-state image pickup unit according to the embodiment of the present technology is of a back-illuminated type in which, in the sensor substrate including the photoelectric conversion sections, a surface opposed to the surface where the drive circuit is formed serves as a light reception surface, and the pad wiring line is directly laminated on the through hole via. Therefore, compared to a configuration in which the pad wiring line is provided on an insulating layer covering the through hole via and the through hole via and the pad wiring line are connected to each other through a connection hole, a configuration in which the number of laminated layers in an insulating film covering the light reception surface is reduced is adopted, and a distance between an on-chip lens formed above the insulating film and the light reception surface is allowed to be reduced.

In a first method of manufacturing a solid-state image pickup unit according to an embodiment of the present technology, first, photoelectric conversion sections are formed in an array in a pixel region provided to a sensor substrate. Moreover, a drive circuit is formed on a surface opposed to a light reception surface for the photoelectric conversion sections of the sensor substrate. Further, a through hole via reaching the drive circuit from the light reception surface of the sensor substrate is formed in a peripheral region located outside the pixel region. After that, a pad wiring line directly laminated on the through hole via is formed on the light reception surface in the peripheral region.

A first electronic apparatus according to an embodiment of the present technology includes the first solid-state image pickup unit according to the above-described embodiment of the present technology and an optical system configured to guide incident light to the photoelectric conversion sections.

A second solid-state image pickup unit according to an embodiment of the present technology includes: a sensor substrate having a pixel region in which photoelectric conversion sections are formed in an array; and a drive circuit provided on a surface opposed to a light reception surface for the photoelectric conversion sections of the sensor substrate. Moreover, a light-shielding film having light reception openings corresponding to the photoelectric conversion sections is provided on the light reception surface in the pixel region, and a protective insulating film is provided to cover the light-shielding film. Further, a plurality of through hole vias embedded from the protective insulating film to the sensor substrate and connected to the drive circuit are provided to a peripheral region located outside the pixel region.

The second solid-state image pickup unit according to the embodiment of the present technology is of a back-illuminated type in which, in the sensor substrate including the photoelectric conversion sections, a surface opposed to the surface where the drive circuit is formed serves as a light reception surface, and the through hole vias are embedded in the protective insulating film covering the light-shielding film on the light reception surface. Therefore, a distance between the light reception surface and the light-shielding film is allowed to be reduced.

In a second method of manufacturing a solid-state image pickup unit according to an embodiment of the present technology, first, photoelectric conversion sections are formed in an array in a pixel region provided to a sensor substrate, and a drive circuit is formed on a surface opposed to a light reception surface for the photoelectric conversion sections of the sensor substrate. Moreover, a light-shielding film is formed on the light reception surface in the pixel region, and a protective insulating film covering the light-shielding film is formed. Further, a plurality of through hole vias embedded from the protective insulating film to the sensor substrate and connected to the drive circuit are formed in a peripheral region located outside the pixel region.

A second electronic apparatus according to an embodiment of the present technology includes the second solid-state image pickup unit according to the above-described embodiment of the present technology and an optical system configured to guide incident light to the photoelectric conversion sections.

In the first solid-state image pickup unit according to the embodiment of the present technology, in the back-illuminated type solid-state image pickup unit in which the pad wiring line is provided on the light reception surface, since the pad wiring line is directly laminated on the through hole via, the number of layers in the insulating film on the light reception surface is allowed to be reduced. As a result, a distance between the on-chip lens formed on the insulating layer and the light reception surface is allowed to be reduced, and light reception characteristics in the photoelectric conversion sections are allowed to be improved. Moreover, in the second solid-state image pickup unit according to the embodiment of the present technology, in the back-illuminated type solid-state image pickup unit, since the through hole vias are provided to be embedded in the protective insulating film covering the light-shielding film on the light reception surface, a distance between the light reception surface and the light-shielding film is allowed to be reduced. As a result, light reception characteristics in the photoelectric conversion sections are allowed to be improved.

BRIEF DESCRIPTION OF DIAGRAMS

FIG. 1 is a schematic diagram illustrating an example of a solid-state image pickup unit to which the present technology is applied.

FIG. 2 is a main-part sectional view illustrating a configuration of a solid-state image pickup unit according to a first embodiment.

FIG. 3 is a process sectional view (No. 1) illustrating a procedure of manufacturing the solid-state image pickup unit according to the first embodiment.

FIG. 4 is a process sectional view (No. 2) illustrating the procedure of manufacturing the solid-state image pickup unit according to the first embodiment.

FIG. 5 is a process sectional view (No. 3) illustrating the procedure of manufacturing the solid-state image pickup unit according to the first embodiment.

FIG. 6 is a process sectional view (No. 4) illustrating the procedure of manufacturing the solid-state image pickup unit according to the first embodiment.

FIG. 7 is a main-part sectional view illustrating a configuration of a solid-state image pickup unit according to a second embodiment.

FIG. 8 is a process sectional view (No. 1) illustrating a procedure of manufacturing the solid-state image pickup unit according to the second embodiment.

FIG. 9 is a process sectional view (No. 2) illustrating the procedure of manufacturing the solid-state image pickup unit according to the second embodiment.

FIG. 10 is a process sectional view (No. 3) illustrating the procedure of manufacturing the solid-state image pickup unit according to the second embodiment.

FIG. 11 is a main-part sectional view illustrating a solid-state image pickup unit according to a third embodiment.

FIG. 12 is a process sectional view (No. 1) illustrating a procedure of manufacturing the solid-state image pickup unit according to the third embodiment.

FIG. 13 is a process sectional view (No. 2) illustrating the procedure of manufacturing the solid-state image pickup unit according to the third embodiment.

FIG. 14 is a main-part sectional view illustrating a configuration of a solid state image pickup unit according to a fourth embodiment.

FIG. 15 is a process sectional view (No. 1) illustrating a procedure of manufacturing the solid-state image pickup unit according to the fourth embodiment.

FIG. 16 is a process sectional view (No. 2) illustrating the procedure of manufacturing the solid-state image pickup unit according to the fourth embodiment.

FIG. 17 is a process sectional view (No. 3) illustrating the procedure of manufacturing the solid-state image pickup unit according to the fourth embodiment.

FIG. 18 is a main-part sectional view illustrating a configuration of a solid-state image pickup unit according to a fifth embodiment.

FIG. 19 is a process sectional view illustrating a procedure of manufacturing the solid-state image pickup unit according to the fifth embodiment.

FIG. 20 is a configuration diagram of an electronic apparatus using a solid-state pickup unit obtained by application of the present technology.

DESCRIPTION OF EMBODIMENTS

Some embodiments of the present technology will be described below in the following order referring to the accompanying diagrams.
1. Schematic Configuration Example of Solid-state Image Pickup Unit According to Embodiment
2. First Embodiment (An example with a cavity structure in which a pad wiring line is directly provided on a through hole via)
3. Second Embodiment (An example with a cavity structure in which a pad wiring line is directly provided on a through hole via configured by integrally forming an embedded wiring portion and a through hole via portion)
4. Third Embodiment (An example in which a pad wiring line is directly provided on a through hole via configured by integrally forming an embedded wiring portion and a through hole via portion)
5. Fourth Embodiment (An example in which a wiring line is provided so as to be embedded in a protective insulating film covering a light-shielding film)
6. Fifth Embodiment (An example in which a protective insulating film is configured of a two-layer structure)
7. Electronic Apparatus (An example of an electronic apparatus using a solid-state image pickup unit)

It is to be noted that components common to respective embodiments are denoted by same reference numerals, and description of the components will not be repeated.

((1. Schematic Configuration Example of Solid-state Image Pickup Unit According to Embodiment))

FIG. 1 illustrates a schematic configuration of a solid-state image pickup unit with a three-dimensional structure as an example of a back-illuminated type solid-state image pickup unit to which the present technology is applied. A solid-state image pickup unit 1 (the following solid-state image pickup units 1-1 to 1-3 and 2-1 to 2-2) illustrated in this diagram includes a sensor substrate 2 in which photoelectric conversion sections are formed in an array and a circuit substrate 9 is bonded to the sensor substrate 2 in a state where the circuit substrate 9 is laminated on the sensor substrate 2.

The sensor substrate 2 has one surface serving as a light reception surface A, and has a pixel region 4 in which a plurality of pixels 3 each including a photoelectric conversion section are two-dimensionally arranged on the light reception surface A. In the pixel region 4, a plurality of pixel driving lines 5 are wired along a row direction, a plurality of vertical signal lines 6 are wired along a column direction, and one pixel 3 is so arranged as to be connected to one pixel driving line 5 and one vertical signal line 6. Each of these pixels 3 includes the photoelectric conversion section, a charge storage section, and a pixel circuit configured of a plurality of transistors (so-called MOS transistors), a capacitor, and the like. It is to be noted that a part of the pixel circuit is disposed on a surface opposed to the light reception surface A. Moreover, a plurality of pixels may share a part of the pixel circuit.

Further, the sensor substrate 2 has a peripheral region 7 located outside the pixel region 4. A pad wiring line 8 (an electrode pad 8) is provided to the peripheral region 7. The pad wiring line 8 is connected to the pixel driving line 5, the vertical signal line 6, and the pixel circuit that are provided to the sensor substrate 2, and a drive circuit provided to the circuit substrate 9 as necessary.

The circuit substrate 9 includes drive circuits such as a vertical drive circuit 10 configured to drive the respective pixels 3 provided to the sensor substrate 2, a column signal processing circuit 11, a horizontal drive circuit 12, and a system circuit control 13 on a surface facing the sensor substrate 2. These drive circuits are connected to the pad wiring line 8 in the sensor substrate 2. it is to be noted that the pixel circuit provided to the surface of the sensor substrate 2 is also one of the drive circuits.

((2. First Embodiment))
(Configuration of Solid-state Image Pickup Unit)
(An Example with a Cavity Structure in which a Pad Wiring Line is Directly Provided on a Through Hole Via)

FIG. 2 is a main-part sectional view illustrating a configuration of a solid-state image pickup unit 1-1 according to a first embodiment, and is a sectional view around a boundary between the pixel region 4 and the peripheral region 7 in FIG. 1. The configuration of the solid-state image pickup unit 1-1 according to the first embodiment will be described below referring to this main-part sectional view.

As described above, the solid-state image pickup unit 1-1 according to the first embodiment illustrated in FIG. 2 is a solid-state image pickup unit with a three-dimensional structure in which the sensor substrate 2 and the circuit substrate 9 are bonded together in a state where the sensor substrate 2 and the circuit substrate 9 are laminated. A wiring layer 2a and a protective film 2b covering the wiring layer 2a are provided on a surface of the sensor substrate 2, i.e., a surface facing the circuit substrate 9 of the sensor substrate 2. On the other hand, a wiring layer 9a and a protective film 9b covering the wiring layer 9a are provided on a surface of the circuit substrate 9, i.e., a surface facing the sensor substrate 2 of the circuit substrate 9. Moreover, a protective film 9c is provided on a back surface of the circuit substrate 9. The sensor substrate 2 and the circuit substrate 9 are bonded together with the protective film 2b and the protective film 9b in between.

Moreover, an insulating layer 14 having a stepwise structure is provided on a surface on a side opposed to the circuit substrate 9, i.e., the light reception surface A of the sensor substrate 2, and through hole vias 23 are provided so as to penetrate the sensor substrate 2 from the insulating layer 14. Moreover, the pad wiring line 8 and a light-shielding film 16 are provided on the insulating layer 14, and a transparent protective film 17, color filters 18, and on-chip lenses 19 are laminated in this order so as to cover the pad wiring line 8 and the light-shielding film 16. It is characteristic of the first embodiment that the pad wiring line 8 are directly laminated on the through hole vias 23.

Next, configurations of respective layers in the sensor substrate 2 and respective layers in the circuit substrate 9, and configurations of the insulating layer 14 having the stepwise structure, the through hole vias 23, the pad wiring line 8, the light-shielding film 16, the transparent protective film 17, the color filters 18, and the on-chip lenses 19 will be described below in this order.

[Sensor Substrate 2]

The sensor substrate 2 may be configured of, for example, a thinned semiconductor substrate made of single-crystal silicon.

A plurality of photoelectric conversion sections 20 are formed in an array along the light reception surface A in the pixel region 4 of the sensor substrate 2. Each of the photoelectric conversion sections 20 may be configured of, for example, a laminate structure including an n-type diffusion layer and a p-type diffusion layer. It is to be noted that one of the photoelectric conversion sections 20 is provided to each of the pixels, and a sectional view of one pixel is illustrated in this diagram.

Moreover, a floating diffusion FD configured of an n+-type impurity layer, a source/drain 21 of a transistor Tr, another impurity layer that is not illustrated in this diagram, a device isolator 22, and the like are provided on the surface opposed to the light reception surface A of the sensor substrate 2. Further, in the sensor substrate 2, the through hole vias 23 that will be described below are provided to the peripheral region 7 located outside the pixel region 4.

[Wiring Layer 2a (on Sensor Substrate 2)]

The wiring layer 2a provided on the surface of the sensor substrate 2 includes a transfer gate TG and a gate electrode 25 of the transistor Tr, and another electrode that is not illustrated in this diagram at an interface with the sensor substrate 2 with a gate insulating film that is not illustrated in this diagram in between. Moreover, the transfer gate TG and the gate electrode 25 are covered with an interlayer insulating film 26, and embedded wiring lines 27 using, for example, copper (Cu) are provided as multilayer wiring lines in a groove pattern provided to the interlayer insulating film 26. These embedded wiring lines 27 are connected to one another through vias, and some of the embedded wiring lines 27 are configured to be connected to the source/drain 21, the transfer gate TG, and the gate electrode 25. Further, the through hole vias 23 provided to the sensor substrate 2 are also connected to the embedded wiring lines 27, and a pixel circuit is configured of the transistor Tr, the embedded wiring lines 27, and the like.

An insulating protective film 2b is provided on the interlayer insulating film 26 in which such embedded wiring lines 27 are formed, and the sensor substrate 2 is bonded to the circuit substrate 9 at a surface of the protective film 2b.

[Circuit Substrate 9]

The circuit substrate 9 may be configured of, for example, a thinned semiconductor substrate made of single-crystal silicon. A source/drain 31 of a transistor Tr, and an impurity layer that is not illustrated in this diagram, a device isolator 32, and the like are provided to a surface layer facing the sensor substrate 2 of the circuit substrate 9.

Moreover, a through hole via 33 penetrating the circuit substrate 9 is provided to the circuit substrate 9. The through hole via 33 is made of a conductive material embedded in a connection hole formed so as to penetrate the circuit substrate 9 with an isolation insulating film 34 in between.

[Wiring Layer 9a (on Circuit Substrate 9)]

A wiring layer 9a provided to the surface of the circuit substrate 9 includes, at an interface with the circuit substrate 9, a gate electrode 35 disposed with a gate insulating film that is not illustrated in this diagram in between, and another electrode that is not illustrated in this diagram. The gate electrode 35 and the other electrode are covered with an interlayer insulating film 36, and embedded wiring lines 37 using, for example, copper (Cu) are provided as multilayer wiring lines in a groove pattern provided to the interlayer insulating film 36. These embedded wiring lines 37 are connected to one another through vias, and some of the embedded wiring lines 37 are configured to be connected to the source/drain 31 and the gate electrode 35. Moreover, the through hole via 33 provided to the circuit substrate 9 is also connected to the embedded wiring lines 37, and a drive circuit is configured of the transistor Tr, the embedded wiring lines 37, and the like.

An insulating protective film 9b is provided on the interlayer insulating film 36 in which such embedded wiring lines 37 are formed, and the circuit substrate 9 is bonded to the sensor substrate 2 at a surface of the protective film 9b. Moreover, in the circuit substrate 9, a protective film 9c covering the circuit substrate 9 is provided on a back surface opposed to the surface where the wiring layer 9a is provided, and a pad opening 33a allowing the through hole via 33 to be exposed is provided to the protective film 9c.

[Insulating Layer 14]

The insulating layer 14 is provided on the light reception surface A of the sensor substrate 2. It is characteristic of the insulating layer 14 to have a stepwise structure in which a film thickness thereof in the pixel region 4 is thinner than a film thickness thereof in the peripheral region 7. Such an insulating layer 14 may be configured as a laminate film using, for example, different insulating materials, and in this case, the insulating layer 14 has, as an example, a four-layer structure including an antireflective film 14-1, an interface state suppression film 14-2, an etching stop film 14-3, and an upper insulating film 14-4 in order from the light reception surface A.

The antireflective film 14-1 may be configured with use of an insulating material with a higher refractive index than that of silicon oxide, for example, hafnium oxide ($HfO_2$), tantalum oxide ($Ta_2O_5$), silicon nitride, or the like. The interface state suppression film 14-2 may be configured with use of, for example, silicon oxide ($SiO_2$).

The etching stop film 14-3 may be configured with use of a material capable of holding down etching selectivity with respect to a material forming the upper insulating film 14-4 disposed thereon, for example, with use of silicon nitride (SiN). The upper insulating film 14-4 may be configured with use of, for example, silicon oxide ($SiO_2$).

The insulating layer 14 with such a four-layer structure is formed in a stepwise structure in which the upper insulating film 14-4 and the etching stop film 14-4 in an upper layer portion of the insulating layer 14 are removed in the pixel region 4 to thin the insulating layer 14 in the pixel region 4, thereby forming a two-layer structure including the antireflective film 14-1 and the interface state suppression film 14-2.

[Through Hole Vias 23]

The respective through hole vias 23 are provided in the peripheral region 7 located outside the pixel region so as to penetrate the sensor substrate 2 from the insulating layer 14 and to reach the embedded wiring line 27 of the wiring layer 2a or the embedded wiring line 37 of the wiring layer 9a. These through hole vias 23 are configured by embedding a conductive material such as copper (Cu) in connection holes, that is formed so as to penetrate the insulating layer 14 and the sensor substrate 2, with an isolation insulating film 24 in between.

[Pad Wiring Line 8]

It is characteristic of the pad wiring line 8 that the pad wiring line 8 is formed on a higher step portion of the insulating layer 14, and is directly laminated on the through hole vias 23 embedded in the insulating layer 14. Such a pad wiring line 8 may include, for example, a wiring portion for connection between a plurality of through hole vias 23 and an electrode pad portion connected to the wiring portion. Such a pad wiring line 8 is disposed so as to be superimposed on the transistor Tr and other devices provided to the sensor substrate 2 and the embedded wiring lines 27, thereby configuring a so-called cup structure. Therefore, flexibility in layout of devices in the sensor substrate 2 and the circuit substrate 9, and the wiring layer 2a and the wiring layer 9a is secured.

The above pad wiring line 8 is configured of a laminate structure including a barrier metal film 8-1 made of, for example, tantalum (Ta), tantalum nitride (TaN), or the like and having a diffusion prevention function with respect to copper (Cu) forming the through hole vias 23 and an aluminum-copper (AlCu) alloy film 8-2 disposed above the barrier metal film 8-1. The pad wiring line 8 with such a laminate structure is covered with a protective insulating film 15 made of, for example, silicon nitride.

Moreover, the pad wiring line 8 configures a bottom of a pad opening 8a formed in the protective insulating film 15 provided so as to cover the pad wiring line 8, and the transparent protective film 17 and a on-chip lens film 19a that will be described later. In other words, the pad wiring line 8 is exposed from the bottom of the pad opening 8a.

[Light-shielding Film 16]

The light-shielding film 16 is provided on a lower step portion of the insulating layer 14, i.e. on the interface state suppression film 14-2 configuring a lower layer portion of the laminate structure of the insulating layer 14 in the pixel region 4 on the light reception surface A. Such a light-shielding film 16 includes a plurality of light reception openings 16a corresponding to the respective photoelectric conversion sections 20.

Such a light-shielding film 16 is configured with use of a conductive material with a high light-shielding property such as aluminum (Al) or tungsten (W), and is provided so as to be grounded to the sensor substrate 2 in a opening 14a provided to the insulating layer 14.

[Transparent Protective Film 17]

The transparent protective film 17 is provided so as to cover the pad wiring line 8 and the light-shielding film 16. The transparent protective film 17 may be configured with use of, for example, an acrylic resin or the like.

[Color Filters 18]

The color filters 18 is provided corresponding to the respective photoelectric conversion sections 20, and are configured of colors corresponding to the respective photoelectric conversion sections 20. Arrangement of the color filters 18 of respective colors is not specifically limited.

[On-chip Lenses 19]

The on-chip lenses 19 are provided corresponding to the respective photoelectric conversion sections 20, and are configured to allow incident light to be condensed to the photoelectric conversion sections 20.

(Method of Manufacturing Solid-state Image Pickup Unit)

Next, a method of manufacturing the solid-state image pickup unit 1-1 with the above-described configuration will be described below referring to process sectional views in FIGS. 3 to 6.

[FIG. 3A]

First, as illustrated in FIG. 3A, a plurality of photoelectric conversion sections 20 arc formed in an array in the pixel region 4 of the sensor substrate 2, and the floating diffusion FD, the source/drain 21, the other impurity layer, and the device isolator 22 are formed in the sensor substrate 2. Next, the transfer gate TG and the gate electrode 25 are formed on the surface of the sensor substrate 2, and the embedded wiring lines 27 are formed together with the interlayer insulating film 26 to configure the wiring layer 2a, and a top of the wiring layer 2a is covered with the protective film 2b. On the other hand, the source/drain 31, the other impurity layer, and the device isolator 32 are formed in the circuit substrate 9. Next, the gate electrode 35 is formed on the surface of the circuit substrate 9, and the embedded wiring lines 37 are formed together with the interlayer insulating film 36 to configure the wiring layer 9a, and the via 33 is formed from the wiring layer 9a to the circuit substrate 9, and a top of the wiring layer 9a is covered with the protective film 9b.

After that, the sensor substrate 2 and the circuit substrate 9 are bonded together with the protective film 2b and the protective film 9b in between. After the bonding is completed, the sensor substrate 2 is thinned on the light reception surface A side as necessary.

The order of the above processes is not specifically limited, and the processes may be executed with use of a typical bonding technique.

[FIG. 3B]

Next, as illustrated in FIG. 3B, the antireflective film 14-1, the interface state suppression film 14-2, the etching stop film 14-3, and the upper insulating film 14-4 are so formed as to be laminated in this order on the light reception surface A of the sensor substrate 2, thereby forming the insulating layer 14 with a four-layer structure. The antireflective film 14-1 may be made of, for example, hafnium oxide ($HfO_2$), and is formed with a film thickness of 10 nm to 300 nm both inclusive (for example, 60 nm) by an atomic layer deposition method. The interface state suppression film 14-2 may be made of, for example, silicon oxide ($SiO_2$), and is formed with a film thickness of 200 nm by a P-CVD (plasma-chemical vapor deposition) method. The etching stop film 14-3 may be made of, for example, silicon nitride (SiN), and is formed with a film thickness of 360 nm by the P-CVD method. The upper insulating film 14-4 may be made of, for example, silicon oxide ($SiO_2$), and is formed with a film thickness of 200 nm by the P-CVD method.

[FIG. 4A]

After that, as illustrated in FIG. 4A, the respective connection holes 23a penetrating the insulating layer 14 and the sensor substrate 2 are formed in the peripheral region 7 of the sensor substrate 2. Each of these connection holes 23a may be formed with each depth reaching a top of the embedded wiring line 27 in the wiring layer 2a disposed on the surface of the sensor substrate 2 or a top of the embedded wiring line 37 in the wiring layer 9a, and the embedded wiring line 27 and the embedded wiring line 37 may not be exposed from a bottom of the connection hole 23a. At this time, a plurality of resist patterns that are not illustrated in this diagram are formed for respective depths of the connection holes 23a, and etching is performed on the sensor substrate 2 and the interlayer insulating film 26 with use of these resist patterns as masks a plurality of times. After each etching is completed, each of the resist patterns is removed.

[FIG. 4B]

Next, as illustrated in FIG. 4B, the isolation insulating film 24 is formed on the insulating layer 14 so as to cover inner walls of the connection holes 23a. In this case, for example, assuming that the isolation insulating film 24 with a two-layer structure is formed, first, a silicon nitride film 24-1 with a film thickness of 70 nm is formed by the p-CVD method, and then a silicon oxide film 24-2 with a film thickness of 900 nm is formed by the p-CVD method. It is to be noted that the isolation insulating film 24 is not limited to a laminate structure, and may have, for example, a single-layer structure of a silicon oxide film or a silicon nitride film.

[FIG. 4C]

After that, as illustrated in FIG. 4C, a portion located on the bottom of each of the connection holes 23a of the isolation insulating film 24 is removed by etching the isolation insulating film 24 under a high anisotropic etching condition. Next, portions located below the bottom of each of the connection holes 23a of the interlayer insulating film 26, the protective film 2b, and the protective film 9b are continuously removed by etching under the high anisotropic etching condition to continue digging the connection holes 23a. Thus, the embedded wiring line 27 or the embedded wiring line 37 is exposed from the bottom of each of the connection holes 23a.

[FIG. 5A]

Next, as illustrated in FIG. 5A, the connection holes 23a are filled with a conductive material to form the through hole vias 23 in the connection holes 23a penetrating the sensor substrate 2. In this case, first, a conductive material film [for example, a copper (Cu) film] is formed on the insulating layer 14 so as to be embedded in the connection holes 23a, and then a portion located on the insulating layer 14 of the conductive material film is removed by polishing by a chemical mechanical polishing (CMP) method.

Therefore, the conductive material film remains only in the connection holes 23a so as to form the through hole vias 23 in the peripheral region 7 on the light reception surface A side of the sensor substrate 2.

[FIG. 5B]

Next, as illustrated in FIG. 5B, the pad wiring line 8 is formed in the peripheral region 7 of the sensor substrate 2. At this time, the barrier metal film 8-1 made of tantalum (Ta), tantalum nitride (TaN), or the like is formed, and then the AlCu alloy film 8-2 is formed so as to be laminated on the barrier metal film 8-1. Then, pattern etching is performed on the AlCu alloy film 8-2 and the barrier metal film 8-1 with use of a resist pattern that is not illustrated in this diagram as a mask. Thus, the pad wiring line 8 directly laminated on the through hole vias 23 is formed in the peripheral region 7. The pad wiring line 8 is configured of a wiring portion configured so as to connect the through hole vias 23 to one another and an electrode pad portion connected to the wiring portion. Such a pad wiring line 8 is formed so as to be superimposed on the transistor Tr, the other device, and the embedded wiring lines 27, thereby configuring a so-called cup structure.

After that, the protective insulating film 15 is formed on the insulating layer 14 so as to cover the pad wiring line 8.

[FIG. 5C]

After that, as illustrated in FIG. 5C, a portion corresponding to the pixel region 4 of the insulating layer 14 is selectively thinned to be thinner than a portion corresponding to the peripheral region 7 of the insulating layer 14 so as to form a stepwise structure in the insulating layer 14. At this time, the protective insulating film 15 made of silicon nitride (SiN) is etched with use of a resist pattern that is not illustrated in this diagram as a mask, and then after etching conditions are changed, the upper insulating film 14-4 made of silicon oxide ($SiO_2$) is etched. At this time, etching stops at the etching stop film 14-3 made of silicon nitride (SiN) below the upper insulating film 14-4. After that, the conditions are changed again, and then the etching stop film 14-3 is etched.

Thus, the insulating layer 14 on the light reception surface A has a stepwise structure in which a film thickness thereof in the pixel region 4 is thinner than a film thickness thereof in the peripheral region 7, i.e., a cavity structure in which a portion in the pixel region 4 of the insulating layer 14 is thinned. In such a state, only the antireflective film 14-1 and the interface state suppression film 14-2 remain in the pixel region 4. On the other hand, the insulating layer 14 with the four-layer structure remains as it is in the peripheral region 7.

It is to be noted that a thin film portion of the insulating layer 14 may be provided to a widest possible range without affecting the pad wiring line 8, and accordingly, incidence of light on the photoelectric conversion sections 20 is prevented from being affected due to worsening of coating unevenness of the transparent protective film that is to be formed in a later process by a stepwise shape of the insulating layer 14.

[FIG. 6A]

Next, as illustrated in FIG. 6A, the opening 14a allowing the sensor substrate 2 to be exposed is formed in a lower step portion of the insulating layer 14. At this time, the interface state suppression film 14-2 and the antireflective film 14-1 are etched with use of a resist pattern that is not illustrated in this diagram as a mask. It is to be noted that the opening 14a is formed in a position not located above the photoelectric conversion sections 20.

Next, the light-shielding film 16 grounded to the sensor substrate 2 through the opening 14a is pattern-formed on the lower step portion of the insulating layer 14. The light-shielding film 16 has light reception openings 16a corresponding to the photoelectric conversion sections 20. In this case, first, a conductive material film having a light-shielding property such as aluminum (Al) or tungsten (W) is formed on the insulating layer 14 by a sputtering film deposition method. After that, the conductive material film is pattern-etched with use of a resist pattern that is not illustrated in this diagram as a mask to form the light-shielding film 16 widely covering the lower step portion (i.e., the pixel region 4) of the insulating layer 14, having the light reception openings 16a corresponding to the respective photoelectric conversion sections 20, and being grounded to the sensor substrate 2.

Such a light-shielding film 16 may have a shape in which a portion thereof located on an upper step portion of the insulating layer 14 is removed and the lower step portion of the insulating layer 14 is widely covered therewith. Thus, a step height difference in the insulating layer 14 is reduced in a wide range.

[FIG. 6B]

Next, as illustrated in FIG. 6B, the transparent protective film 17 made of a material with light transparency is formed so as to cover the pad wiring line 8 and the light-shielding film 16. The transparent protective film 17 is formed by a coating method such as a spin coating method. Next, the color filters 18 of respective colors corresponding to the photoelectric conversion sections 20 are formed on the transparent protective film 17, and an on-chip lens film 19a including the on-chip lenses 19 corresponding to the photoelectric conversion sections 20 is formed on the color filters 18.

[FIG. 2]

After the above processes, as illustrated in FIG. 2, the pad opening 8a allowing the pad wiring line 8 to be exposed is formed in the peripheral region 7. At this time, pattern etching is performed on the on-chip lens film 19a, the transparent protective film 17, and the protective insulating film 15 with use of a resist pattern that is not illustrated in this diagram as a mask to form the pad opening 8a allowing the pad wiling line 8 to be exposed.

Moreover, an exposed surface of the circuit substrate 9 is polished to thin the circuit substrate 9 and to expose the via 33, thereby forming the through hole via 33. After that, the solid-state image pickup unit 1-1 is completed by forming the protective film 9c on the circuit substrate 9 so as to cover the through hole via 33, and forming the pad opening 33a that allows the through hole via 33 to be exposed.

(Effects of First Embodiment)

The solid-state image pickup unit 1-1 with the above-described configuration is of a back-illuminated type in which the surface opposite to the surface where the drive circuit is formed serves as the light reception surface A, and has, above the light reception surface A, a configuration in which the pad wiring line 8 is directly laminated on the through hole vias 23 that are provided so as to penetrate the sensor substrate 2. Therefore, compared to a configuration in which the pad wiring line 8 is disposed on the through hole vias 23 with a diffusion prevention insulating film in between and they are connected to each other through connection holes, the solid-state image pickup unit 1-1 has a configuration without the diffusion prevention insulating film; therefore, the number of manufacturing processes is allowed to be reduced, and an insulating film laminated on the light reception surface A including the peripheral region 7 is allowed to be reduced. At this time, diffusion of copper (Cu) forming the through hole vias 23 is allowed to be prevented by providing the barrier metal film 8-1 in a lowermost layer of the pad wiring line 8 without providing the diffusion prevention insulating film.

Moreover, in the solid-state image pickup unit 1-1 according to the first embodiment, the insulating layer 14 with a stepwise structure in which the film thickness thereof in the pixel region 4 is thinner than the film thickness thereof in the peripheral region 7 is provided on the light reception surface A, and the on-chip lenses 19 are provided on the insulating layer 14. Therefore, while the insulating layer 14 secures a film thickness necessary for insulation of the pad wiring line 8 in the peripheral region 7, a portion in the pixel region 4 of the insulating layer 14 is allowed to be thinned to reduce a distance between the on-chip lenses 19 disposed on the insulating layer 14 and the light reception surface A.

Further, in this stepwise structure, as described above, the number of laminated insulating films formed on the light reception surface A including the peripheral region 7 is reduced; therefore, while the insulating layer 14 secures a film thickness necessary for insulation of the pad wiring line 8, a height of the upper step portion of the insulating layer 14 is allowed to be reduced. Accordingly, the transparent protective film 17 covering the stepwise structure including the pad wiring line 8 is allowed to be thinned, and the distance between the on-chip lenses 19 formed above the transparent protective film 17 and the light reception surface A is allowed to be reduced.

As a result, issues in optical characteristics such as attenuation of incident light on the photoelectric conversion sections 20 and deterioration in color-mixing due to leakage of light to adjacent pixels at oblique light incidence are allowed to be solved.

Moreover, specifically in the manufacturing method according to the first embodiment, as described referring to FIG. 5C, in a case where the stepwise structure is formed in the insulating layer 14, as a procedure, after etching stops at the etching stop film 14-3, the conditions are changed, and then the etching stop film 14-3 is etched. Therefore, the antireflective film 14-1 and the interface state suppression film 14-2 are allowed to remain on the light reception surface A of the pixel region 4 with high controllability. As a result, stable light reception characteristics and a dark current prevention effect are allowed to be obtained. Moreover, the light reception surface A is allowed to be favorably maintained without exposing the light reception surface A to etching damage.

It is to be noted that, in the above-described solid-state image pickup unit 1-1 according to the first embodiment, as illustrated in FIG. 2, a configuration in which the pad wiring line 8 and the light-shielding film 16 are configured of layers different from each other is described. However, the solid-state image pickup unit 1-1 according to the first embodiment may have a configuration in which the pad wiring line 8 and the light-shielding film 16 arc configured of a same layer. In this case, in a process of forming the pad wiring line 8 described referring to FIG. 5B, the light-shielding film 16 may be formed at the same time, and the formation of the protective insulating film 15 may be removed. Therefore, the number of manufacturing processes and the number of laminated insulating films on the light reception surface A are allowed to be further reduced.

(Second Embodiment)
(Configuration of Solid-state Image Pickup Fit)
(An Example with a Cavity Structure in which a Pad Wiring Line is Directly Provided on a Through Hole via Configured by Integrally Forming an Embedded Wiring Portion and a Through Hole Via Portion)

FIG. 7 is a main-part sectional view illustrating a configuration of a solid-state image pickup unit 1-2 according to a second embodiment, and is a sectional view around the boundary between the pixel region 4 and the peripheral region in FIG. 1. The configuration of the solid-state image pickup unit 1-2 according to the second embodiment will be described below referring to the main-part sectional view.

The solid-state image pickup unit 1-2 according to the second embodiment illustrated in FIG. 7 differs from the solid-state image pickup unit according to the first embodiment described referring to FIG. 2 in that a through hole via 28 is configured of an embedded wiring portion 29 and through hole via portions 30 formed integrally with the embedded wiring portion 29, and other configurations of the solid-state image pickup unit 1-2 are similar to those in the first embodiment.

More specifically, the embedded wiring portion 29 configuring the through hole via 28 is configured by filling a wiring groove 29a formed from the insulating layer 14 with the four-layer structure to the sensor substrate 2 with a conductive material such as copper (Cu) with the isolation insulating film 24 in between. It is to be noted that a depth to which the embedded wiring portion 29 is embedded is not limited to a depth reaching from the insulating layer 14 to the sensor substrate 2 as illustrated in this diagram, and the embedded wiring portion 29 may be embedded only in a range of the thickness of the insulating layer 14.

Moreover, the through hole via portion 30 configuring the through hole via 28 is configured by filling a plurality of connection holes 30a provided so as to penetrate from a bottom of the wiring groove 29a to the sensor substrate 2 with a conductive material such as copper (Cu) with the isolation insulating film 24 in between. The through hole via portions 30 provided in the respective connection holes 30a are connected to one another by the embedded wiring portion 29.

Moreover, each of these through hole via portions 30 is provided so as to reach the embedded wiring line 27 of the wiring layer 2a or the embedded wiring line 27 of the wiring layer 9a.

It is characteristic of the second embodiment that the pad wiring line 8 is directly laminated on the through hole via 28 configured in the above-described fashion.

(Method of Manufacturing Solid-state Image Pickup Unit)

Next, a method of manufacturing the solid-state image pickup unit 1-2 with the above-described configuration will be described below referring to process sectional views in FIGS. 8 to 10.

[FIG. 8A]

First, as illustrated in FIG. 8A, processes up to a process of bonding the sensor substrate 2 and the circuit substrate together and thinning the sensor substrate 2 on the light reception surface A side as necessary are performed as with the processes described referring to FIG. 3A in the first embodiment. After that, the insulating layer 14 with a four-layer structure including the antireflective film 14-1, the interface state suppression film 14-2, the etching stop film 14-3, and the upper insulating film 14-4 is formed on the light reception surface A of the sensor substrate 2.

Next, in the peripheral region 7 of the sensor substrate 2, the wiring groove 29a is formed from the insulating layer 14 to a surface layer located on the light reception surface A side of the sensor substrate 2. At this time, layers from the insulating layer 14 to the surface layer of the sensor substrate 2 are etched with use of a resist pattern that is not illustrated in the diagram as a mask. After the etching is completed, the resist pattern is removed.

[FIG. 8B]

Next, as illustrated in FIG. 8B, respective connection holes 30a having depths as necessary are formed at a bottom of the wiring groove 29a. As with the first embodiment, each of the connection holes 30a is formed with each depth reaching the top of the embedded wiring line 27 provided on the surface side of the sensor substrate 2 or the top of the embedded wiring line 37. After that, similar processes to the processes described referring FIGS. 4B, 4C, and 5A in the first embodiment are performed.

[FIG. 9A]

Therefore, as illustrated in FIG. 9A, the isolation insulating film 24 with a laminate structure is formed on inner walls of the wiring groove 29a and the connection holes 30a, and the wiring groove 29a and the connection holes 30a are integrally filled with copper (Cu) to form the through hole via 28 connected to the embedded wiring line 27 or the embedded wiring line 37. The through hole via 28 is configured of the embedded wiring portion 29 embedded in the wiring groove 29a and the through hole via portions 30 embedded in the connection holes 30a.

Moreover, after that, following processes illustrated in FIGS. 9B and following diagrams are performed in a similar fashion to the processes described referring to FIG. 5A and following diagrams.

[FIG. 9B]

Specifically, first, as illustrated in FIG. 9B, the pad wiring line 8 is formed in the peripheral region 7 of the sensor substrate 2. At this time, first, the barrier metal film 8-1 made of tantalum (Ta), tantalum nitride (TaN), or the like is formed, and then the AlCu alloy film 8-2 is formed so as to be laminated on the bather metal film 8-1. Then, pattern etching is performed on the AlCu alloy film 8-2 and the barrier metal film 8-1 with use of a resist pattern that is not illustrated in this diagram as a mask. Thus, the pad wiring line 8 directly laminated on the through hole via 28 is formed in the peripheral region 7. Such a pad wiring line 8 is formed so as to be superimposed on with the transistor Tr, the other device, and the embedded wiring lines 27, thereby configuring a so-called cup structure. Therefore, flexibility in layout of devices in the sensor substrate 2 and the circuit substrate 9, and the wiring layer 2a and the wiring layer 9a is secured.

After that, the protective insulating film 15 is formed on the insulating layer 14 so as to cover the pad wiring line 8.

[FIG. 9C]

After that, as illustrated in FIG. 9C, a portion corresponding to the pixel region 4 of the insulating layer 14 is selectively thinned to be thinner than a portion corresponding to the peripheral region 7 of the insulating layer 14 so as to form a stepwise structure in the insulating layer 14. At this time, the protective insulating film 15 made of silicon nitride (SiN) is etched with use of a resist pattern that is not illustrated in this diagram as a mask, and then after etching conditions are changed, the upper insulating film 14-4 made of silicon oxide ($SiO_2$) is etched. At this time, etching stops at the etching stop film 14-3 made of silicon nitride (SiN) below the upper insulating film 14-4. After that, the conditions are changed again, and then the etching stop film 14-3 is etched.

Thus, the insulating layer 14 on the light reception surface A has a stepwise structure in which the film thickness thereof in the pixel region 4 is thinner than the film thickness thereof in the peripheral region 7, i.e., a cavity structure in which a portion in the pixel region 4 of the insulating layer 14 is thinned. In such a state, only the antireflective film 14-1 and the interface state suppression film 14-2 remain in the pixel region 4. On the other hand, the insulating layer 14 with the four-layer structure remains as it is in the peripheral region 7.

It is to be noted that a thin film portion of the insulating layer 14 may be provided to a widest possible range without affecting the pad wiring line 8, and accordingly, incidence of light on the photoelectric conversion sections 20 is prevented from being affected due to worsening of coating unevenness of the transparent protective film that is to be formed in a later process by a stepwise shape of the insulating layer 14.

[FIG. 10A]

Next, as illustrated in FIG. 10A, the opening 14*a* allowing the sensor substrate 2 to be exposed is formed in a lower step portion of the insulating layer 14. At this time, the interface state suppression film 14-2 and the antireflective film 14-1 are etched with use of a resist pattern that is not illustrated in this diagram as a mask. It is to be noted that the opening 14*a* is formed in a position not located above the photoelectric conversion sections 20.

Next, the light-shielding film 16 grounded to the sensor substrate 2 through the opening 14*a*, is pattern-formed on the lower step portion of the insulating layer 14. The light-shielding film 16 has the light reception openings 16*a* corresponding to the photoelectric conversion sections 20. In this case, first, a conductive material film having a light-shielding property such as aluminum (Al) or tungsten (W) is formed on the insulating layer 14 by a sputtering film deposition method. After that, the conductive material film is pattern-etched with use of a resist pattern that is not illustrated in this diagram as a mask to form the light-shielding film 16 widely covering the lower step portion of the insulating layer 14, having the light reception openings 16*a* corresponding to respective photoelectric conversion sections 20, and being grounded to the sensor substrate 2.

Such a light-shielding film 16 may have a shape in which a portion thereof located on an upper step portion of the insulating layer 14 is removed and the lower step portion of the insulating layer 14 is widely covered therewith. Thus, a step height difference in the insulating layer 14 is reduced in a wide range.

[FIG. 10B]

Next, as illustrated in FIG. 10B, the transparent protective film 17 made of a material with light transparency is formed so as to cover the pad wiring line 8 and the light-shielding film 16. The transparent protective film 17 is formed by a coating method such as a spin coating method. Next, the color filters 18 of respective colors corresponding to the photoelectric conversion sections 20 are formed on the transparent protective film 17, and the on-chip lens film 19*a* including the on-chip lenses 19 corresponding to the photoelectric conversion sections 20 is formed on the color filters 18.

[FIG. 7]

After the above processes, as illustrated in FIG. 7, the pad opening 8*a* allowing the pad wiring line 8 to be exposed is formed in the peripheral region 7. At this time, pattern etching is performed on the on-chip lens film 19*a*, the transparent protective film 17, and the protective insulating film 15 with use of a resist pattern that is not illustrated in this diagram as a mask to form the pad opening 8*a* allowing the pad wiring line 8 to be exposed.

Moreover, an exposed surface of the circuit substrate 9 is polished to thin the circuit substrate 9 and to expose the via 33, thereby forming the through hole via 33. After that, the solid-state image pickup unit 1-2 is completed by forming the protective film 9*c* on the circuit substrate 9 so as to cover the through hole via 33, and forming the pad opening 33*a* that allows the through hole via 33 to be exposed.

(Effects of Second Embodiment)

As with the solid-state image pickup unit according to the first embodiment, the above-described solid-state image pickup unit 1-2 according to the second embodiment is of a back-illuminated type in which the surface opposite to the surface where the drive circuit is formed serves as the light reception surface A, and has, above the light reception surface A, a configuration in which the pad wiring line 8 is directly laminated on the through hole vias 23 that are provided so as to penetrate the sensor substrate 2. Moreover, the insulating layer 14 with a stepwise structure in which the film thickness thereof in the pixel region 4 is thinner than the film thickness thereof in the peripheral region 7 is provided on the light reception surface A, and the on-chip lenses 19 are provided on the insulating layer 14.

Therefore, as with the first embodiment, the number of manufacturing processes is allowed to be reduced. Moreover, the distance between the on-chip lenses 19 formed above the transparent protective film 17 and the light reception surface A is allowed to be reduced, and issues in optical characteristics such as attenuation of incident light on the photoelectric conversion sections 20 and deterioration in color-mixing due to leakage of light to adjacent pixels at oblique light incidence are allowed to be solved.

Further, specifically in the solid-state image pickup unit 1-2 according to the second embodiment, the through hole via 28 configured by integrally forming the embedded wiring portion 29 and the through hole via portion 30 is provided, and the pad wiring line 8 is laminated on the through hole via 28. Therefore, a part of the pad wiring line 8 is lined with the embedded wiring portion 29 of the through hole via 28 to be thickened, and mechanical strength is allowed to be enhanced accordingly. As a result, an influence of bonding to the pad wiring line 8 on devices such as the transistor Tr and the like formed below the pad wiring line 8 is allowed to be reduced.

Moreover, in the manufacturing method according to the second embodiment, as described referring to FIG. 9C, in a case where a stepwise structure is formed in the insulating layer 14, as a procedure, after etching stops at the etching stop film 14-3, the conditions are changed, and then the etching stop film 14-3 is etched.

Therefore, as with the first embodiment, the antireflective film 14-1 and the interface state suppression film 14-2 are allowed to remain on the light reception surface A in the pixel region 4 with high controllability, and stable light reception characteristics and the dark current prevention effect are allowed to be obtained without exposing the light reception surface A to etching damage.

Further, as with the first embodiment, the solid-state image pickup unit 1-2 according to the second embodiment may also have a configuration in which the pad wiring line 8 and the light-shielding film 16 are configured of a same layer, and the number of manufacturing processes and the number of laminated insulating films on the light reception surface A are allowed to be further reduced accordingly.

((Third Embodiment))

(Configuration of Solid-state Image Pickup Unit)

(An Example in which a Pad Wiring Line is Directly Provided on a Through Hole Via Configured by Integrally Forming an Embedded Wiring Portion and a Through Hole Via Portion)

FIG. 11 is a main-part sectional view illustrating a configuration of a solid-state image pickup unit 1-3 according to a third embodiment, and is a sectional view around the boundary between the pixel region 4 and the peripheral region 7 in FIG. 1. The configuration of the solid-state image pickup unit 1-3 according to the third embodiment will be described below referring to the main-pail sectional view.

The solid-state image pickup unit 1-3 according to the third embodiment illustrated in FIG. 11 differs from the solid-state image pickup unit according to the first embodiment described referring to FIG. 2 in that the through hole via 28 is configured of the embedded wiring portion 29 and the through hole via portion 30, and an insulating layer 14' does not have a stepwise structure. Accordingly, the solid-state image pickup unit 1-3 according to the third embodiment illustrated in FIG. 11 differs from the solid-state image pickup unit according to the first embodiment described referring to FIG. 2 in that the insulating layer 14' is configured of a two-layer structure. Other configurations of the solid-state image pickup unit 1-3 are similar to those in the first embodiment.

More specifically, the light-shielding film 16 is provided on the light reception surface A of the sensor substrate 2 with the insulating layer 14' with a two-layer structure in between, and an upper insulating film 51 is provided on the light-shielding film 16. Moreover, it is characteristic of the solid-state image pickup unit 1-3 that the through hole vias 28 are provided so as to penetrate the sensor substrate 2 from the upper insulating film 51 and the pad wiring line 8 is provided so as to be directly laminated on the through hole vias 28. Moreover, the transparent protective film 17, the color filters 18, and the on-chip lenses 19 are laminated in this order on the upper insulating film 51 so as to cover them. Configurations of the insulating layer 14', the light-shielding film 16, the upper insulating film 51, the through hole vias 28, and the pad wiring line 8 that are characteristic in the third embodiment will be described below.

[Insulating Layer 14']

The insulating layer 14' is provided on the entire light reception surface A including the pixel region 4 and the peripheral region 7, and has a two-layer structure in which the antireflective film 14-1 and the interface state suppression film 14-2 are laminated in this order from the light reception surface A. The antireflective film 14-1 of these films may be configured with use of, for example, an insulating material with a higher refractive index than that of silicon oxide, such as hafnium oxide (HfO$_2$), tantalum oxide (Ta$_2$O$_5$) or silicon nitride. The interface state suppression film 14-2 may be configured with use of, for example, silicon oxide (SiO$_2$).

[Light-shielding Film 16]

The light-shielding film 16 is provided on a top of the insulating layer 14', i.e., a top of the interface state suppression film 14-2 in the pixel region 4 on the light reception surface A side. Such a light-shielding film 16 has a plurality of light reception openings 16a corresponding to the respective photoelectric conversion sections 20. Moreover, the light-shielding film 16 is configured with use of a conductive material with a high light-shielding property such as aluminum (Al) or tungsten (W), and is provided so as to be grounded to the sensor substrate 2 in an opening 14a' provided to the insulating layer 14'.

[Upper Insulating Film 51]

The upper insulating film 51 is provided on the entire light reception surface A including the pixel region 4 and the peripheral region 7 so as to cover the light-shielding film 16. Such an upper insulating film 51 may be configured with use of, for example, silicon oxide (SiO$_2$).

[Through Hole Via 28]

The through hole via 28 is similar to that in the second embodiment, and is configured of the embedded wiring portion 29 and the through hole via portions 30 formed integrally with the embedded wiring portion 29, and the through hole via portions 30 are connected to one another by the embedded wiring portion 29. It is to be noted that, as illustrated in the diagram, a depth to which the embedded wiring portion 29 is embedded is not limited to a depth reaching from the upper insulating film 51 to the sensor substrate 2, and the embedded wiring portion 29 may be embedded only in a range to a thickness of the upper insulating film 51 or the insulating layer 14'.

[Pad Wiring Line 8]

It is characteristic of the pad wiring line 8 that the pad wiring line 8 is formed on a top of the upper insulating film 51 in the peripheral region 7 on the light reception surface A and is directly laminated on the through hole vias 28 embedded in the upper insulating film 51. Such a pad wiring line 8 may include, for example, a wiring portion for connection between a plurality of through hole vias 28 and the electrode pad portion connected to the wiring portion. Moreover, the pad wiring line 8 is disposed so as to be superimposed on the transistor Tr and the other devices provided to the sensor substrate 2 and the embedded wiring lines 27, thereby configuring a so-called cup structure. Therefore, flexibility in layout of devices in the sensor substrate 2 and the circuit substrate 9, and the wiring layer 2a and the wiring layer 9a is secured.

As layers above the pad wiring line 8, the transparent protective film 17, the color filters 18, and the on-chip lens film 19a including the on-chip lenses 19 are configured to be laminated in this order, and the pad wiring line 8 is exposed from the bottom of the pad opening 8a provided to them.

(Method of Manufacturing Solid-state Image Pickup Unit)

Next, a method of manufacturing the solid-state image pickup unit 1-3 with the above-described configuration will be described below referring to process sectional views in FIGS. 12 to 13.

[FIG. 12A]

First, as illustrated in FIG. 12A, the sensor substrate 2 and the circuit substrate are bonded together, and processes up to a process of bonding the sensor substrate 2 and the circuit substrate together and thinning the sensor substrate 2 on the light reception surface A as necessary are performed as with the processes described referring to FIG. 3A in the first embodiment. After that, the insulating layer 14' with a two-layer structure including the antireflective film 14-1 and the interface state suppression film 14-2 is formed on the light reception surface A of the sensor substrate 2.

[FIG. 12B]

Next, as illustrated in FIG. 12B, the opening 14a' allowing the sensor substrate 2 to be exposed is formed in a portion corresponding to the pixel region 4 of the insulating layer 14'. At this time, the interface state suppression film 14-2 and the antireflective film 14-1 are etched with use of a resist pattern that is not illustrated in this diagram as a mask. It is to be noted that the opening 14a' is formed in a position not located above the photoelectric conversion sections 20.

Next, the light-shielding film 16 grounded to the sensor substrate 2 through the opening 14a' is pattern-formed on the insulating layer 14'. The light-shielding film 16 has light reception openings 16a corresponding to the photoelectric conversion sections 20. In this case, first, a conductive material film having a light-shielding property such as aluminum (Al) or tungsten (W) is formed on the insulating layer 14' by a sputtering film deposition method. After that, the conductive material film is pattern-etched with use of a resist pattern that is not illustrated in this diagram as a mask to form the light-shielding film 16 having the light reception openings 16a corresponding to the respective photoelectric conversion sections 20 and being grounded to the sensor substrate 2.

[FIG. 12C]

Next, as illustrated in FIG. 12C, the upper insulating film 51 is formed on a top of the insulating layer 14' so as to cover the light-shielding film 16. After that, in the peripheral region 7 of the sensor substrate 2, the wiring groove 29*a* is formed from the upper insulating film 51 to the surface layer located on the light reception surface A side of the sensor substrate 2. At this time, layers from the upper insulating film 51 to the surface layer of the sensor substrate 2 are etched with use of a resist pattern that is not illustrated in the diagram as a mask. After the etching is completed, the resist pattern is removed.

[FIG. 13A]

Next, as illustrated in FIG. 13A, respective connection holes 30*a* having depths as necessary are formed at the bottom of the wiring groove 29*a*. As with the first embodiment, each of the connection holes 30*a* is formed with each depth reaching the top of the embedded wiring line 27 disposed on the surface side of the sensor substrate 2 or the top of the embedded wiring line 37. After that, similar processes to the processes described with use of FIGS. 4B, 4C, and 5A in the first embodiment are performed.

[FIG. 13B]

Therefore, as illustrated in FIG. 13A, the isolation insulating film 24 with a laminate structure is formed on inner walls of the wiring groove 29*a* and the connection holes 30*a*, and the wiring groove 29*a* and the connection holes 30*a* are integrally filled with copper (Cu) to form the through hole via 28 connected to the embedded wiring line 27 or the embedded wiring line 37. The through hole via 28 is configured of the embedded wiring portion 29 embedded in the wiring groove 29*a* and the through hole via portions 30 embedded in the connection holes 30*a*.

[FIG. 13C]

Next, as illustrated in FIG. 13C, the pad wiring line 8 is formed in the peripheral region 7 of the sensor substrate 2. At this time, first, the barrier metal film 8-1 made of tantalum (Ta), tantalum nitride (TaN), or the like is formed, and then the AlCu alloy film 8-2 is formed so as to be laminated on the barrier metal film 8-1. Then, pattern etching is performed on the AlCu alloy film 8-2 and the barrier metal film 8-1 with use of a resist pattern that is not illustrated in this diagram as a mask. Thus, the pad wiring line 8 directly laminated on the through hole via 28 is formed in the peripheral region 7. Such a pad wiring line 8 is formed so as to be superimposed on the transistor Tr, the other device, and the embedded wiring lines 27, thereby configuring a so-called cup structure.

After that, the transparent protective film 17 made of a material with light transparency is formed so as to cover the pad wiring line 8 and the light-shielding film 16. The transparent protective film 17 is formed by a coating method such as a spin coating method. Next, the color filters 18 of respective colors corresponding to the photoelectric conversion sections 20 are formed on the transparent protective film 17, and the on-chip lens film 19*a* including the on-chip lenses 19 corresponding to the photoelectric conversion sections 20 is formed on the color filters 18.

[FIG. 11]

After the above processes, as illustrated in FIG. 11, the pad opening 8*a* allowing the pad wiring line 8 to be exposed is formed in the peripheral region 7. At this time, pattern etching is performed on the on-chip lens film 19*a*, the transparent protective film 17, and the protective insulating film 15 with use of a resist pattern that is not illustrated in this diagram as a mask to form the pad opening 8*a* allowing the pad wiring line 8 to be exposed.

Moreover, an exposed surface of the circuit substrate 9 is polished to thin the circuit substrate 9 and to expose the via 33, thereby forming the through hole via 33. After that, the solid-state image pickup unit 1-2 is completed by forming the protective film 9*c* on the circuit substrate 9 so as to cover the through hole via 33, and forming the pad opening 33*a* that allows the through hole via 33 to be exposed.

(Effects of Third Embodiment)

As with the solid-state image pickup unit according to the first embodiment, the above-described solid-state image pickup unit 1-3 according to the third embodiment is of a back-illuminated type in which the surface opposite to the surface where the drive circuit is formed serves as the light reception surface A, and has, above the light reception surface A, a configuration in which the pad wiring line 8 is directly laminated on the through hole vias 23 that are provided so as to penetrate the sensor substrate 2. Therefore, compared to a configuration in which the pad wiring line 8 is disposed on the through hole vias 23 with a diffusion prevention insulating film in between and they are connected to one another through the connection holes, the solid-state image pickup unit 1-3 has a configuration without the diffusion prevention insulating film; therefore, an insulating film laminated on the light reception surface A including the peripheral region 7 is allowed to be reduced. Moreover, the number of manufacturing processes is allowed to be reduced. At this time, diffusion of copper (Cu) forming the through hole vias 23 is allowed to be prevented by providing the barrier metal film 8-1 in a lowermost layer of the pad wiring line 8 without providing the diffusion prevention insulating film.

As a result, a distance between the on-chip lenses 19 and the light reception surface A in the pixel region 4 is allowed to be reduced in the pixel region 4, and issues in optical characteristics such as attenuation of incident light on the photoelectric conversion sections 20 and deterioration in color-mixing due to leakage of light to adjacent pixels at oblique light incidence are allowed to be solved.

Moreover, specifically in the solid-state image pickup unit 1-3 according to the third embodiment, as with the second embodiment, the through hole via 28 configured by integrally forming the embedded wiring portion 29 and the through hole via portion 30 is provided, and the pad wiring line 8 is laminated on the through hole via 28. Therefore, as with the second embodiment, a part of the pad wiring line 8 is lined with the embedded wiring portion 29 of the through hole via 28 to be thickened, and mechanical strength is allowed to be enhanced accordingly. As a result, an influence of bonding to the pad wiring line 8 on devices such as the transistor Tr and the like formed below the pad wiring line 8 is allowed to be reduced.

In the above-described first to third embodiments, a configuration in which the light-shielding film 16 is disposed above the light reception surface A is described. However, the present technology is applicable to a configuration without the light-shielding film 16, and similar effects are also obtainable in the configuration.

Moreover, in the above-described first to third embodiments, a configuration in which the present technology is applied to the solid-state image pickup unit with a three-dimensional structure as an example of the back-illuminated type solid-state image pickup unit is described. However, the present technology is not limited to the back-illuminated type solid-state image pickup unit with the three-dimensional structure, and may be widely applied to back-illuminated type solid-state image pickup units. Moreover, the laminate structure in the insulating layer with a stepwise structure is not limited to the laminate structures described in the respective embodiments, and various laminate structures suitable for formation of wiring and an improvement in light reception characteristics are applicable.

((4. Fourth Embodiment))
(Configuration of Solid-state Image Pickup Unit)
(An Example in which a Wiring Line is Provided so as to be Embedded in a Protective Insulating Film Covering a Light-shielding Film)

FIG. 14 is a main-part sectional view illustrating a configuration of a solid-state image pickup unit 2-1 according to a fourth embodiment, and is a sectional view around the boundary between the pixel region 4 and the peripheral region in FIG. 1. The configuration of the solid-state image pickup unit 2-1 according to the fourth embodiment will be described below referring to the main-part sectional view.

As described above, the solid-state image pickup unit 2-1 according to the fourth embodiment illustrated in FIG. 14 is a solid-state image pickup unit with a three-dimensional structure in which the sensor substrate 2 and the circuit substrate 9 are bonded together in a state where the sensor substrate 2 and the circuit substrate 9 are laminated. The wiring layer 2a and the protective film 2b covering the wiring layer 2a are provided on the surface of the sensor substrate 2, i.e., the surface facing the circuit substrate 9 of the sensor substrate 2. On the other hand, the wiring layer 9a and the protective film 9b covering the wiring layer 9a are provided on the surface of the circuit substrate 9, i.e., the surface facing the sensor substrate 2 of the circuit substrate 9. Moreover, the protective film 9c is provided on the back surface of the circuit substrate 9. The sensor substrate 2 and the circuit substrate 9 are bonded together with the protective film 2b and the protective film 9b in between.

Moreover, an antireflective film 41, an interface state suppression film 42, a light-shielding film 43, and a protective insulating film 44 are provided on the light reception surface A of the sensor substrate 2. A wiring line 45 and the through hole vias 23 that are provided so as to penetrate the sensor substrate 2 from the wiring line 45 are embedded in the protective insulating film 44.

A cap film 46 is provided on the protective insulating film 44 so as to cover the wiring line 45 and the through hole vias 23. Moreover, color filters 47 and on-chip lenses 48 are laminated on the cap film 46 in the pixel region 4. Further, the pad opening 8a is provided to the peripheral region 7.

Next, configurations of respective layers in the sensor substrate 2 and respective layers in the circuit substrate 9, and configurations of the antireflective film 41, the interface state suppression film 42, the light-shielding film 43, the protective insulating film 44, the through hole vias 23, the wiring line 45, the cap film 46, the color filters 47, the on-chip lenses 48, and the pad opening 8a will be described below in this order.

[Sensor Substrate 2]

The sensor substrate 2 may be configured of, for example, a thinned semiconductor substrate made of single-crystal silicon.

A plurality of photoelectric conversion sections 20 are formed in an array along the light reception surface A in the pixel region 4 of the sensor substrate 2. Each of the photoelectric conversion sections 20 may be configured of, for example, a laminate structure including an n-type diffusion layer and a p-type diffusion layer. It is to be noted that one of the photoelectric conversion sections 20 is provided to each of the pixels, and a sectional view of one pixel is illustrated in this diagram.

Moreover, the floating diffusion FD configured of an n+-type impurity layer, the source/drain 21 of the transistor Tr, another impurity layer that is not illustrated in this diagram, the device isolator 22, and the like are provided on the surface opposed to the light reception surface A of the sensor substrate 2.

Further, in the sensor substrate 2, the though hole vias 23 that will be described below are provided to the peripheral region 7 located outside the pixel region 4.

[Wiring Layer 2a (on Sensor Substrate 2)]

The wiring layer 2a provided on the surface of the sensor substrate 2 includes the transfer gate TG and the gate electrode 25 of the transistor Tr, and another electrode that is not illustrated in this diagram at the interface with the sensor substrate 2 with a gate insulating film that is not illustrated in the diagram in between. Moreover, the transfer gate TG and the gate electrode 25 are covered with the interlayer insulating film 26, and the embedded wiring lines 27 using, for example, copper (Cu) are provided as multi-layer wiring lines in a groove pattern provided to the interlayer insulating film 26. These embedded wiring lines 27 are connected to one another through vias, and some of the embedded wiring lines 27 are configured to be connected to the source/drain 21, the transfer gate TG, and the gate electrode 25. Further, the through hole vias 23 provided to the sensor substrate 2 are also connected to the embedded wiring lines 27, and a pixel circuit is configured of the transistor Tr, the embedded wiring lines 27, and the like. In this case, one layer of the multilayer wiring line is configured as an aluminum (Al) wiring line, and a part disposed in the peripheral region of the wiring line serves as the electrode pad 8.

The insulating protective film 2b is provided on the interlayer insulating film 26 in which such multilayer wiring lines arc formed, and the sensor substrate 2 is bonded to the circuit substrate 9 at a surface of the protective film 2b.

[Circuit Substrate 9]

The circuit substrate 9 may be configured of, for example, a thinned semiconductor substrate made of single-crystal silicon. The source; drain 31 of the transistor Tr, and an impurity layer that is not illustrated in the diagram, the device isolator 32, and the like are provided to a surface layer facing the sensor substrate 2 of the circuit substrate 9.

Moreover, the through hole via 33 penetrating the circuit substrate 9 is provided to the circuit substrate 9. The through hole via 33 is made of a conductive material embedded in a connection hole formed so as to penetrate the circuit substrate 9 with the isolation insulating film 34 in between.

[Wiring Layer 9a (on Circuit Substrate 9)]

The wiring layer 9a provided to the surface of the circuit substrate 9 includes the gate electrode 35 provided with a gate insulating film that is not illustrated in this diagram in between, and another electrode that is not illustrated in this diagram at an interface with the circuit substrate 9. The gate electrode 35 and the other electrode are covered with the interlayer insulating film 36, and the embedded wiring lines 37 using, for example, copper (Cu) are provided as multi-layer wiring lines in a groove pattern provided to the interlayer insulating film 36. These embedded wiring lines 37 are connected to one another through vias, and some of the embedded wiring lines 37 are configured to be connected to the source/drain 31 and the gate electrode 35. Moreover, the through hole via 33 provided to the circuit substrate 9 and the through hole via 23 provided to the sensor substrate 2 are also connected to the embedded wiring lines 37, and a drive circuit is configured of the transistor Tr, the embedded wiring lines 37, and the like. In this case, as necessary, one layer, for example, an uppermost layer of the multilayer wiring line may be configured as an aluminum (Al) wiring line, and a part disposed in the peripheral region of the wiring line may serve as an electrode pad.

The insulating protective film 9b is provided on the interlayer insulating film 36 in which such embedded wiring lines 37 are formed, and the circuit substrate 9 is bonded to the sensor substrate 2 at a surface of the protective film 9b. Moreover, in the circuit substrate 9, the protective film 9c covering the circuit substrate 9 is provided on a back surface opposite to the surface where the wiring layer 9a is provided, and the pad opening 33a allowing the through hole via 33 to be exposed is provided to the protective film 9c.

[Antireflective Film 41 and Interface State Suppression Film 42]

The antireflective film 41 and the interface state suppression film 42 are provided on the light reception surface A of the sensor substrate 2 in this order. The antireflective film 41 may be configured with use of an insulating material with a higher refractive index than that of silicon oxide, for example, hafnium oxide (HfO$_2$), tantalum oxide (Ta$_2$O$_5$), or silicon nitride. The interface state suppression film 42 may be configured with use of, for example, silicon oxide (SiO$_2$).

[Light-shielding Film 43]

The light-shielding film 43 is provided on the light reception surface A with the antireflective film 41 and the interface state suppression film 42 in between in the pixel region 4. Such a light-shielding film 43 has a plurality of light reception openings 43a corresponding to respective photoelectric conversion section 20.

Such a light-shielding film 43 is configured with use of a conductive material with a high light-shielding property such as aluminum (Al) or tungsten (W), and is provided so as to be grounded to the sensor substrate 2 in an opening 43b provided to the antireflective film 41 and the interface state suppression film 42.

[Protective Insulating Film 44]

The protective insulating film 44 is provided in the peripheral region 7 and the pixel region 4 on the light reception surface A side so as to cover the light-shielding film 43 and to have a flat surface. Such a protective insulating film 44 may be configured with use of, for example, silicon oxide (SiO$_2$).

[Wiring Line 45]

The wiring line 45 is provided in the peripheral region 7 on the light reception surface A side as an embedded wiring line that is embedded in the protective insulating film 44 covering the light-shielding film 43. The wiring line 45 is so formed as to be embedded integrally with the through hole vias 23, and connects the through hole vias 23 to one another.

[Through Hole Vias 23]

The through hole vias 23 are provided so as to penetrate the interface state suppression film 42 and the antireflective film 41 from the wiring line 45 in the peripheral region 7 on the light reception surface A side, and to further penetrate the sensor substrate 2, thereby reaching the wiring layer 2a. A plurality of the through hole vias 23 are provided, and are connected to the embedded wiring lines 27 of the sensor substrate 2 and an aluminum wiring line or the embedded wiring lines 37 of the circuit substrate 9 and an aluminum wiring line.

Such through hole vias 23 are integrally configured by filling a wiring groove formed in the protective insulating film 44 and connection holes on a bottom of the wiring groove with copper (Cu) with the isolation insulating film 24 continuously covering inner walls of the wiring groove and the connection holes in between. The wiring groove corresponds to the wiring line 45, and the connection holes correspond to the through hole vias 23. Moreover, the isolation insulating film 24 may be configured with use of, for example, a material having a diffusion prevention function with respect to copper (Cu), such as silicon nitride (SiN). Thus, when the through hole vias 23 are connected to one another through the wiring line 45, the embedded wiring lines 27 connected to the through hole vias 23 of the sensor substrate 2 and the embedded wiring lines 37 connected to the through hole vias 23 of the circuit substrate 9 are electrically connected to each other. In other words, the drive circuit of the sensor substrate 2 and the drive circuit of the circuit substrate 9 are connected to each other.

[Cap Film 46]

The cap film 46 is provided on the protective insulating film 44 in the peripheral region 7 and the pixel region 4 on the light reception surface A side so as to cover the wiring line 45 formed integrally with the through hole vias 23. The cap film 46 is made of a material having a diffusion prevention function with respect to the copper (Cu) that is the material used for the through hole vias 23 and the wiring line 45, for example, the cap film 46 may be configured with use of silicon nitride (SiN).

[Color Filters 47 and On-chip Lenses 48]

The color filters 47 are provided corresponding to the respective photoelectric conversion sections 20, and are configured of colors corresponding to the respective photoelectric conversion sections 20. Arrangement of the color filters 47 of respective colors is not specifically limited.

The on-chip lenses 48 are provided corresponding to the respective photoelectric conversion sections 20, and are configured to allow incident light to be condensed to the photoelectric conversion sections 20.

It is to be noted that, as necessary, an adhesive coating film or a planarization coating film may be provided between the cap film 46 and the color filters 47. Each of the adhesive coating film and the planarization coating film may be configured of, for example, a film made of an acrylic resin.

[Pad Opening 8a]

The pad opening 8a is provided in the peripheral region so as to penetrate an on-chip lens material film 38a, the cap film 46, the protective insulating film 44, the interface state suppression film 42, and the antireflective film 41 on the light reception surface A, and further penetrate the sensor substrate 2. The pad opening 8a allows the electrode pad 8 in the wiring layer 2a on the sensor substrate 2 to be exposed.

(Effects of Solid-state Image Pickup Unit 2-1 According to Fourth Embodiment)

In the above-described solid-state image pickup unit 2-1 according to the fourth embodiment, the through hole vias 23 and the wiring line 45 are embedded in the protective insulating film 44 covering the light-shielding film 43 on the light reception surface A of the sensor substrate 2, and the cap film 46 is provided on the protective insulating film 44 so as to cover this. In other words, the cap film 46 is provided above the light-shielding film 43. Therefore, compared to a configuration in which the cap film is provided below the light-shielding film in related art, a distance between the light reception surface A and the light-shielding film 43 is allowed to be reduced. Therefore, color-mixing due to leakage of light to adjacent pixels at oblique light incidence, shading when an angle of incidence is increased, attenuation of incident light, and the like are allowed to be reduced, and light reception characteristics in the photoelectric conversion sections 20 are allowed to be improved.

Moreover, the solid-state image pickup unit 2-1 according to the fourth embodiment has a dual damascene structure in which the wiring line 45 is provided on the light reception surface A and is formed integrally with the through hole vias 23. Further, the electrode pad 8 is provided on the wiring layer 2a on a side opposite to the light reception surface A of the sensor substrate 2, and the pad opening 8a allowing the electrode pad 8 to be exposed is provided so as to penetrate the sensor substrate 2 from the light reception surface A. In other words, the electrode pad 8 configured of a thick film is not provided on the light reception surface A, and only the wiring line 45 configured of a thin film is provided on the light reception surface A. Therefore, compared to a configuration in which the electrode pad configured of a thick film is provided on the light reception surface, a height of a layer structure on the light reception surface A is allowed to be reduced, and a distance between the light reception surface A and the on-chip lenses 48 is allowed to be reduced.

For example, in the solid-state image pickup unit 2-1 according to the fourth embodiment in which the electrode pad is not provided on the light reception surface, this distance is allowed to be close to about 630 nm. Therefore, color-mixing due to leakage of light to adjacent pixels at oblique light incidence, shading when an angle of incidence is increased, attenuation of incident light, and the like are allowed to be reduced, and the light reception characteristics in the photoelectric conversion sections 20 are allowed to be improved.

(Method of Manufacturing Solid-state Image Pickup Unit)

Next, a method of manufacturing the solid-state image pickup unit 2-1 with the above-described configuration will be described below referring to process sectional views in FIGS. 15 to 17.

As illustrated in FIG. 15A, a plurality of photoelectric conversion sections 20 are formed in an array in the pixel region 4 of the sensor substrate 2, and the floating diffusion FD, the other impurity layer, and the device isolator 22 are formed in the sensor substrate 2. Next, the transfer gate TG and the gate electrode 25 are formed on the surface of the sensor substrate 2, and the embedded wiring lines 27 are formed together with the interlayer insulating film 26 to configure the wiring layer 2a, and a top of the wiring layer 2a is covered with the protective film 2b. On the other hand, the source/drain 31, the other impurity layer, and the device isolator 32 are formed in the circuit substrate 9. Next, the gate electrode 35 is formed on the surface of the circuit substrate 9, and the embedded wiring lines 37 are formed together with the interlayer insulating film 36 to configure the wiring layer 9a, and the via 33 is formed from the wiring layer 9a to the circuit substrate 9, and a top of the wiring layer 9a is covered with the protective film 9b. It is to be noted that, as necessary, one layer of the multilayer wiring line of the wiring layer 2a or the wiring layer 9a is formed as an aluminum (Al) wiring line, and a part disposed in the peripheral region of the wiring line serves as the electrode pad 8.

After that, the sensor substrate 2 and the circuit substrate 9 are bonded together with the protective film 2b and the protective film 9b in between. After the bonding is completed, the sensor substrate 2 is thinned on the light reception surface A side as necessary.

The order of the above processes is not specifically limited, and the processes are allowed to be executed with use of a typical bonding technique.

As illustrated in FIG. 15B, the antireflective film 41 and the interface state suppression film 42 are so formed as to be laminated in this order on the light reception surface A of the sensor substrate 2. The antireflective film 41 may be made of, for example, hafnium oxide ($HfO_2$), and is formed with a film thickness of 10 nm to 300 nm both inclusive (for example, 60 nm) by an atomic layer deposition method. The interface state suppression film 42 may be made of, for example, silicon oxide ($SiO_2$), and is formed with a film thickness of 100 nm by a P-CVD (plasma-chemical vapor deposition) method.

Next, the light reception opening 43b allowing the sensor substrate 2 to be exposed is formed in the antireflective film 41 and the interface state suppression film 42. At this time, the interface state suppression film 42 and the antireflective film 41 are etched with use of a resist pattern that is not illustrated in this diagram as a mask. It is to be noted that the light reception opening 43b is formed in a position not located above the photoelectric conversion sections 20 in the pixel region 4.

Next, the light-shielding film 43 grounded to the sensor substrate 2 through the light reception opening 43b formed in the antireflective film 41 and the interface state suppression film 42 is pattern-formed. The light-shielding film 43 has the light reception openings 43a corresponding to the photoelectric conversion sections 20. In this case, first, a conductive material film having a light-shielding property such as aluminum (Al) or tungsten (W) is formed on the insulating layer 14 by a sputtering film deposition method. After that, the conductive material film is pattern-etched with use of a resist pattern that is not illustrated in this diagram as a mask to form the light-shielding film 43 that has the light reception openings 43a corresponding to respective photoelectric conversion sections 20 and is grounded to the sensor substrate 2. The light-shielding film 43 is formed not in the peripheral region 7 but in the pixel region 4.

As illustrated in FIG. 16A, in the peripheral region 7 and the pixel region 4 of the sensor substrate 2, the protective insulating film 44 is formed on the interface state suppression film 42 and the light-shielding film 43, and a surface of the protective insulating film 44 is planarized by a chemical mechanical polishing (CMP) method. At this time, the protective insulating film 44 may be made of, for example, silicon oxide ($SiO_2$), and is formed by the P-CVD method. The film thickness of the protective insulating film 44 planarized by the CMP is adjusted to allow a thickness from a top surface of the interface state suppression film 44 to a top surface of the protective insulating film 44 to be about 400 nm.

After that, in the peripheral region 7 of the sensor substrate 2, the wiring groove 45a is formed in the protective insulating film 44. At this time, the protective insulating film 44 made of silicon oxide ($SiO_2$) is etched with use of a resist pattern that is not illustrated in this diagram as a mask. After the etching is completed, the resist pattern is removed.

As illustrated in FIG. 16B, respective connection holes 23a having depths as necessary are formed at a bottom of the wiring groove 45a. The respective connection holes 23a may be formed with each depth reaching the top of the embedded wiring line 27 in the wiring layer 2a provided on the surface side of the sensor substrate 2 and the top of the embedded wiring line 37 in the wiring layer 9a, and the embedded wiring line 27 and the embedded wiring line 37 may not be exposed from the bottoms of the connection holes 23a. At this time, resist patterns that are not illustrated in this diagram are formed for respective depths of the connection holes 23a, and etching is performed on the sensor substrate 2 and the interlayer insulating film 26 with use of these resist patterns as masks a plurality of times. After each etching is completed, each of the resist patterns is removed.

As illustrated in FIG. 16C, the isolation insulating film 24 is formed on the protective insulating film 44 so as to cover inner walls of the wiring groove 45a and the connection holes 23a. In this case, for example, assuming that the isolation insulating film 24 with a two-layer structure is formed, first, the silicon nitride film 24-1 with a film thickness of 70 nm is formed by the p-CVD method, and then the silicon oxide film 24-2 with a film thickness of 900 nm is formed by the p-CVD method. It is to be noted that the isolation insulating film 24 is not limited to a laminate structure, and may have, for example, a single-layer structure of a silicon oxide film or a silicon nitride film.

As illustrated in FIG. 17A, a portion located on the protective insulating film 44 of the isolation insulating film 24, a portion located on the bottom of the wiring groove 45a of the isolation insulating film 24, and a portion located on the bottom of each of the connection holes 23a of the isolation insulating film 24 are removed by etching the isolation insulating film 24 under a high anisotropic etching condition. Next, portions located below the bottom of each of the connection holes 23a of the interlayer insulating film 26, the protective film 2b, and the protective film 9b are continuously removed by etching under the high anisotropic etching condition to continue digging the connection holes 23a. Thus, the embedded wiring lines 27, the aluminum wiring line, and the embedded wiring lines 37 are exposed from the bottoms of the respective connection holes 23a.

As illustrated in FIG. 17B, the wiring groove 45a and the connection holes 23a are integrally filled with a conductive material to form the wiring line 45 as an embedded wiring line in the wiring groove 45a and to form the through hole vias 23 in the connection holes 23a penetrating the sensor substrate 2. In this case, first, a conductive material film [for example, a copper (Cu) film] is formed on the protective insulating film 44 so as to be embedded in the wiring groove 45a and the connection holes 23a, and then a portion located on the protective insulating film 44 of the conductive material film is removed by polishing by the chemical mechanical polishing (CMP) method. Therefore, the conductive material film remains only in the wiring groove 45a and the connection holes 23a to form the wiring line 45 and the through hole vias 23 connected to the wiring line 45 in the peripheral region 7 on the light reception surface A side of the sensor substrate 2.

As illustrated in FIG. 17C, the cap film 46 having a diffusion prevention effect with respect to copper (Cu) forming the through hole vias 23 and the wiring line 45 is formed on the protective insulating film 44 so as to cover the wiring line 45 formed integrally with the through hole vias 23. In this case, as the cap film 46, for example, a silicon nitride film may be formed with a film thickness of 70 nm. It is to be noted that, as necessary, a silicon oxide film may be further formed on the cap film 46 made of silicon nitride as an uppermost layer.

After that, as illustrated in FIG. 14, the color filters 18 of respective colors corresponding to the photoelectric conversion sections 20 are formed on the cap film 46, and the on-chip lenses 48 corresponding to the photoelectric conversion sections 20 are formed on the color filters 18.

Next, the pad opening 8a allowing the electrode pad 8 formed on the wiring layer 2a on the sensor substrate 2 side to be exposed to the light reception surface A is formed in the peripheral region 7. At this time, a resist pattern that is not illustrated in this diagram is formed on an on-chip lens material film 48a. The on-chip lens material film 48a, the cap film 46, the protective insulating film 44, the interface state suppression film 42, the antireflective film 41, the sensor substrate 2, and the wiring layer 2a are etched in order with use of the resist pattern as a mask. When the electrode pad 8 is exposed, the etching is completed, and the resist pattern is removed.

Moreover, an exposed surface of the circuit substrate 9 is polished to thin the circuit substrate 9 and to expose the via 33, thereby forming the through hole via 33. After that, the protective film 9c is formed on the circuit substrate 9 so as to cover the through hole via 33, and the pad opening 33a allowing the through hole via 33 to be exposed is formed.

Thus, the solid-state image pickup unit 2-1 is completed.

(Effects of Manufacturing Method According to Fourth Embodiment)

The method of manufacturing the above-described solid-state image pickup unit 2-1 according to the fourth embodiment is performed by a procedure in which the light-shielding film 43 is first formed, and then the through hole vias 23 and the wiring line 45 are formed. By this procedure, the cap film 46 covering the through hole vias 23 and the wiring line 45 is provided above the light-shielding film 43. On the other hand, in a manufacturing method in related art, the through hole vias are formed before forming the light-shielding film as a procedure; therefore, the cap film covering the through hole vias is provided below the light-shielding film, Therefore, compared to such a manufacturing method in related art, in the method of manufacturing the solid-state image pickup unit 2-1 according to the fourth embodiment, a distance between the light reception surface A and the light-shielding film 43 is allowed to be reduced.

Moreover, in the manufacturing method according to the fourth embodiment, the wiring groove 45a and the connection holes 23a extending from the bottom of the wiring groove 45a are embedded to integrally form the through hole vias 23 and the wiring line 45, and the wiring line 45 is formed on the light reception surface A. Further, the electrode pad 8 is formed in the wiring layer 2a on a side opposite to the light reception surface A of the sensor substrate 2. In other words, only the wiring line 45 is formed on the light reception surface A, and the electrode pad 8 configured of a thick film is not formed on the light reception surface A. Therefore, compared to a case where the electrode pad configured of a thick film is formed on the light reception surface, the height of the layer structure on the light reception surface A is allowed to be reduced, and the distance between the light reception surface A and the on-chip lenses 48 is allowed to be reduced.

Thus, in the method of manufacturing the solid-state image pickup unit 2-1 according to the fourth embodiment, a configuration in which the distance between the light reception surface A and the light-shielding film 43 is small, and the distance between the light reception surface A and the on-chip lenses 48 is small is allowed to be formed. Therefore, color-mixing due to leakage of light to adjacent pixels at oblique light incidence, shading when an angle of incidence is increased, attenuation of incident light, and the like are allowed to be reduced, and the light reception characteristics in the photoelectric conversion section 20 are allowed to be improved.

Moreover, in the method of manufacturing the solid-state image pickup unit 2-1 according to the fourth embodiment, the protective insulating film 44 is formed so as to cover the light-shielding film 43 with an uneven shape, and the protective insulating film 44 is planarized by the CMP, and then the wiring line 45 is formed so as to be embedded. The wiring groove 45a for formation of an embedded wiring line is pattern-formed in the planarized protective insulating film 44; therefore, the wiring line 45 is allowed to be formed with high pattering accuracy.

((6. Fifth Embodiment))
(Configuration of Solid-state Image Pickup Unit)
(An Example in which a Protective Insulating Film is Configured of a Two-layer Structure)

FIG. 18 is a main-part sectional view illustrating a configuration of a solid-state image pickup unit 2-2 according to a fifth embodiment, and is a sectional view around the boundary between the pixel region 4 and the peripheral region in FIG. 1. The configuration of the solid-state image pickup unit 2-2 according to the fifth embodiment will be described below referring to the main-part sectional view.

The solid-state image pickup unit 2-2 according to the fifth embodiment illustrated in FIG. 18 differs from the solid-state image pickup unit according to the fourth embodiment described referring to FIG. 14 in that the protective insulating film 44 has a two-layer structure, and other configurations are similar to those in the fourth embodiment.

More specifically, the protective insulating film 44 has a two-layer structure including a low refractive index film 44a, and a high refractive index film 44b that are laminated in this order on the light-shielding film 43. The low refractive index film 44a, is a thin film, and a surface of the low refractive index film 44a, follows a pattern shape of the light-shielding film; therefore, the low refractive index film 44a, has an uneven surface. On the other hand, the high refractive index film 44b is a thick film that is thick enough or more than enough to embed a recessed section by the light reception opening 43a of the light-shielding film 43 therein, and a surface of the high refractive index film 44b is planarized.

Such a low refractive index film 44a, is made of a material with a refractive index of 1.5 or less, and, for example, silicon oxide (SiO$_2$) may be used. The high refractive index film 44b is made of a material with a refractive index of 1.5 or more, and, for example, silicon nitride (SiN) may be used.

In the above-described solid-state image pickup unit 2-2 according to the fifth embodiment, a configuration on the light reception surface A is as follows. The protective insulating film 44 configured of a two-layer structure covering the light-shielding film 43 is provided, the through hole vias 23 and the wiring line 45 are integrally embedded in the protective insulating film 44, and the cap film 46 covering them is provided on the protective insulating film 44.

(Effects of Solid-state Image Pickup Unit 2-2 According to Fifth Embodiment)

In the above-described solid-state image pickup unit 2-2 according to the fifth embodiment, as with the fourth embodiment, the cap film 46 is provided above the light-shielding film 43 on the light reception surface A. Therefore, also in the solid-state image pickup unit 2-2 according to the fifth embodiment, compared to a configuration in which the cap film covering the through hole vias is provided below the light-shielding film in related art, the distance between the light reception surface A and the light-shielding film 43 is allowed to be reduced.

Moreover, in the solid-state image pickup unit 2-2 according to the fifth embodiment, as with the fourth embodiment, the electrode pad 8 is provided not on the light reception surface A but in the wiring layer 2a on a side opposite to the light reception surface A of the sensor substrate 2. In other words, the electrode pad 8 configured of a thick film is not provided on the light reception surface A, and only the wiring line 45 configured of a thin film is provided on the light reception surface A. Therefore, compared to a configuration in which the electrode pad configured of a thick film is provided on the light reception surface, the height of a layer structure on the light reception surface A is allowed to be reduced, and the distance between the light reception surface A and the on-chip lens 48 is allowed to be reduced.

Thus, as with the fourth embodiment, the solid-state image pickup unit 2-2 according to the fifth embodiment has a configuration in which the distance between the light reception surface A and the light-shielding film 43 is small and the distance between the light reception surface A and the on-chip lenses 48 is small, Therefore, color-mixing due to leakage of light to adjacent pixels at oblique light incidence, shading when an angle of incidence is increased, attenuation of incident light, and the like are allowed to be reduced, and the light reception characteristics in the photoelectric conversion section 20 are allowed to be improved.

Moreover, in the solid-state image pickup unit 2-2 according to the fifth embodiment, unlike the fourth embodiment, the protective insulating film 44 has a two-layer structure including the low refractive index film 44a, and the high refractive index film 44b. First, absorption of incident light by the light-shielding film 43 is reduced by the low refractive index film 44a, provided on the light-shielding film 43. Further, in the recessed portion by the light reception opening 43a of the light-shielding film 43 above the photoelectric conversion section 20, the low refractive index film 44a, is provided on side walls and a bottom of the recessed portion, and the high refractive index film 44b is provided on the low refractive index film 44a, so as to embed the recessed portion therein. Therefore, a waveguide configuration is formed above the photoelectric conversion section 20. As a result, light condensing efficiency for a fine pixel size is allowed to be enhanced, and a finer solid-state image pickup unit is achievable.

(Method of Manufacturing Solid-state Image Pickup Unit)

Next, a method of manufacturing the solid-state image pickup unit 2-2 with the above-described configuration will be described below referring to a process sectional view in FIG. 19.

The manufacturing method according to the fifth embodiment is similar to the manufacturing method according to the fourth embodiment until bonding of the sensor substrate 2 and the circuit substrate 9 and formation of the light-shielding film 43 on the light reception surface A that arc described referring to FIGS. 15A and 15B. A process of forming the protective insulating film 44 on the light-shielding film 43, and subsequent processes in the manufacturing method according to the fifth embodiment are different from those in the manufacturing method according to the fourth embodiment.

As illustrated in FIG. 19A, the low refractive index film 44a, is formed on the interface state suppression film 42 and the light-shielding film 43 on the light reception surface A of the sensor substrate 2. At this time, in a case where the light-shielding film 43 has a film thickness of 230 nm, the low refractive index film 44a, may be formed with use of, for example, silicon oxide (SiO$_2$) so as to have a film thickness of 100 nm. In this case, the low refractive index film 44a, may be formed in the recessed portion by the light reception opening 43a of the light-shielding film 43 in the form of a thin film along the side walls and a bottom surface of the recessed portion.

As illustrated in FIG. 19, the high refractive index film 44b is formed on the low refractive index film 44a, and the surface of the high refractive index film 44b is planarized by the CMP method. At this time, the high refractive index film 44b may be made of, for example, silicon nitride (SiN), and is formed by the P-CVD method. The film thickness of the high refractive index film 44b planarized by the CMP is adjusted to allow a thickness from the top surface of the interface state suppression film 42 to the top surface of the protective insulating film 44 to be about 430 nm. In this case, the high refractive index film 44b may be formed with a thickness that is thick enough to embed the recessed portion by the light reception opening 43a of the light-shielding film 43 therein. Thus, the protective insulating film 44 configured of two layers, i.e., the low refractive index film 44a, and the high refractive index film 44b is formed.

It is to be noted that polishing may be performed until the low refractive index film 44a, is exposed by the CMP after formation of the high refractive index film 44b to allow the high refractive index film 44b to eventually remain only in the recessed portion by the light reception opening 43a.

Processes following this process are performed as with the fourth embodiment described referring to FIGS. 16 and 17. In other words, the through hole vias 23 and the wiring line 45 are integrally formed so as to be embedded in the protective insulating film 44 with a two-layer structure, the cap film 46 is formed so as to cover them, the color filters 47 and the on-chip lenses 48 are formed on the cap film 46, and the pad opening 8a is formed. Thus, the solid-state image pickup unit 2-2 according to the fifth embodiment is completed.

It is to be noted that the wiring line 45 may be embedded only in the high refractive index film 44b, or may be embedded to a depth across the high refractive index film 44b and the low refractive index film 44a.

(Effects of Manufacturing Method According to Fifth Embodiment)

The above-described method of manufacturing the solid-state image pickup unit 2-2 according the second embodiment, as with the fourth embodiment, as a procedure, the light-shielding film 43 is first formed, and then the through hole vias 23 and the wiring line 45 are formed. By this procedure, the cap film 46 covering the through hole vias 23 and the wiring line 45 is provided not below but above the light-shielding film 43. Therefore, in the method of manufacturing the solid-state image pickup unit 2-2 according to the fifth embodiment, the distance between the light reception surface A and the light-shielding film 43 is allowed to be reduced.

Moreover, in the manufacturing method according to the fifth embodiment, as with the fourth embodiment, the through hole vias 23 and the wiring line 45 are so formed as to be integrally embedded in the protective insulating film 44 on the light reception surface A. Further, the electrode pad 8 is formed in the wiring layer 2a on a side opposite to the light reception surface A of the sensor substrate 2. In other words, only the wiring line 45 configured of a thin film is formed on the light reception surface A, and the electrode pad configured of a thick film is not formed on the light reception surface A. Therefore, compared to a case where the electrode pad configured of a thick film is formed on the light reception surface, the height of the layer structure on the light reception surface A is allowed to be reduced, and the distance between the light reception surface A and the on-chip lenses 48 is allowed to be reduced.

As described above, in the method of manufacturing the solid-state image pickup unit 2-2 according to the fifth embodiment, as with the fourth embodiment, a configuration in which the distance between the light reception surface A and the light-shielding film 43 is small and the distance between the light reception surface A and the on-chip lenses 48 is small is allowed to be formed. Therefore, color-mixing due to leakage of light to adjacent pixels at oblique light incidence, shading when an angle of incidence is increased, attenuation of incident light, and the like are allowed to be reduced, and the light reception characteristics in the photoelectric conversion section 20 are allowed to be improved.

Moreover, in the manufacturing method according to the fifth embodiment, unlike the fourth embodiment, the protective insulating film 44 is configured as a two-layer structure including the low refractive index film 44a, and the high refractive index film 44b. First, absorption of incident light by the light-shielding film 43 is allowed to be reduced by forming the low refractive index film 44a, on the light-shielding film 43. Further, in the recessed portion by the light reception opening 43a of the light-shielding film 43 above the photoelectric conversion section 20, the low refractive index film 44a, is formed on the side walls and the bottom of the recessed portion, and the high refractive index film 44b is so formed as to embed the recessed portion therein. Therefore, a waveguide configuration is formed on the photoelectric conversion section 20. As a result, light condensing efficiency for a fine pixel size is allowed to be enhanced, and a finer solid-state image pickup unit is achievable.

It is to be noted that, in the above-described fourth and fifth embodiments, a configuration in which the wiring line 45 is embedded in the protective insulating film 44 on the light reception surface A of the sensor substrate 2 is described. However, a configuration in which the wiring line 45 is embedded to a depth from the protective insulating film 44 to the sensor substrate 2 may be adopted. Also in this case, the cap film 46 covering the through hole vias 23 and the wiring line 45 is provided above the light-shielding film 43; therefore, the distance between the light reception surface A and the light-shielding film 43 is allowed to be reduced. As a result, similar effects to those in the fourth and fifth embodiments are obtainable.

Moreover, in the above-described fourth and fifth embodiments, a configuration in which the through hole vias 23 and the wiring line 45 are integrally formed, and are both made of copper is described. However, a configuration in which the through hole vias and the wiring line are separately formed, and an aluminum wiring line on the through hole vias serves as electrode pad may be adopted. In other words, after formation of the light-shielding film, first, the through hole vias are formed with use of copper so as to be embedded, and then the cap film 46 for copper diffusion prevention is formed so as to cover the through hole vias, and after that, the aluminum wiring line connecting the through hole vias to one another is pattern-formed on the cap film. Further, as necessary, a pad opening allowing the aluminum wiring line to be exposed is provided. In this case, the cap film 46 covering the through hole vias 23 and the wiring line 45 is also provided above the light-shielding film 43; therefore, the distance between the light reception surface A and the light-shielding film 43 is allowed to be reduced. As a result, similar effects to those in the fourth and fifth embodiments are obtainable.

Further, in the above-described fourth and fifth embodiments, a configuration in which the present technology is applied to a solid-state image pickup unit with a three-dimensional structure as an example of the back-illuminated solid-state image pickup unit is described. However, the present technology is not limited to the back-illuminated type solid-state image pickup units with the three-dimensional structure, and may be widely applied to back-illuminated type solid-state image pickup units.

((5. Example of Electronic Apparatus using Solid-state Image Pickup Unit))

The solid-state image pickup unit according to any of the above-described embodiments of the present technology is applicable to electronic apparatuses including, for example, camera systems such as digital cameras and video cameras, cellular phones having an image pickup function, and any other apparatuses having an image pickup function.

FIG. 14 illustrates a configuration diagram of a camera using the solid-state image pickup unit as an example of an electronic apparatus according to an embodiment of the present technology. An example of the camera according to this embodiment is a video camera capable of taking a still image and a moving image. A camera 90 includes a solid-state image pickup unit 91, an optical system 93 configured to guide incident light to a light reception sensor section of the solid-state image pickup unit 91, a shutter unit 94, a drive circuit 95 configured to drive the solid-state image pickup unit 91, and a signal processing circuit 96 configured to process an output signal of the solid-state image pickup unit 91.

Any of the solid-state image pickup units with configurations described in the above respective embodiments is applied as the solid-state image pickup unit 91. The optical system (optical lens) 93 is configured to form an image on an image pickup plane of the solid-state image pickup unit 91. Therefore, a signal charge is stored in the solid-state image pickup unit 91 for a certain period. Such an optical system 93 may be an optical lens system configured of a plurality of optical lenses. The shutter unit 94 controls a light application period and light-shielding period for the solid-state image pickup unit 91. The drive circuit 95 supplies a drive signal to the solid-state image pickup unit 91 and the shutter unit 94, and controls a signal output operation to the signal processing circuit 96 of the solid-state image pickup unit 91 and a shutter operation of the shutter unit 94 in response to the supplied drive signal (timing signal). In other words, the drive circuit 95 performs a signal transfer operation from the solid-state image pickup unit 91 to the signal processing circuit 96 by supplying the drive signal (timing signal). The signal processing circuit 96 performs various kinds of signal processing on a signal transferred from the solid-state image pickup unit 91. A signal-processed image signal is stored in a storage medium such as a memory, or is output to a monitor.

In the electronic apparatus according to the above-described embodiment, since any of the solid-state image pickup units with favorable light reception characteristics described in the above-described first to fifth embodiments is used, high-definition image pickup in the electronic apparatus with an image pickup function or downsizing of the electronic apparatus are achievable.

It is to be noted the present technology may have the following configurations.

(1) A solid-state image pickup unit including:
a sensor substrate having a pixel region in which photoelectric conversion sections are formed in an array;
a drive circuit provided on a surface opposed to a light reception surface for the photoelectric conversion sections of the sensor substrate;
a through hole via provided in a peripheral region located outside the pixel region to reach the drive circuit from the light reception surface of the sensor substrate; and
a pad wiring line directly laminated on the through hole via on the light reception surface in the peripheral region.

(2) The solid-state image pickup unit according to (1), including:
a protective film provided on the light reception surface to cover the pad wiring line;
an on-chip lens provided on the protective film; and
a pad opening provided to the protective film to allow the pad wiring line to be exposed.

(3) The solid-state image pickup unit according to (1) or (2), in which a device is disposed in a position superimposed on the pad wiring line on the surface of the sensor substrate.

(4) The solid-state image pickup according to any one of (1) to (3), in which
the through hole via includes an embedded wiring portion provided to the light reception surface of the sensor substrate and a through hole via portion formed integrally with the embedded wiring portion, and
the pad wiring line is directly laminated on the embedded wiring portion.

(5) The solid-state image pickup unit according to (4), in which the embedded wiring portion is embedded on the light reception surface side of the sensor substrate.

(6) The solid-state image pickup unit according to any one of (1) to (5), in which
a light-shielding film having light reception openings corresponding to the photoelectric conversion sections is provided on the light reception surface in the pixel region with an insulating layer in between, and
the pad wiring line and the light-shielding film are configured of a same layer.

(7) The solid-state image pickup unit according to any one of (1) to (5), in which
an insulating layer with a stepwise structure in which a film thickness thereof in the pixel region is thinner than a film thickness thereof in the peripheral region located outside the pixel region is provided on the light reception surface,
the pad wiring line is provided on an upper step portion of the insulating layer, and
a light-shielding film having light reception openings corresponding to the photoelectric conversion sections is provided on a lower step portion of the insulating layer.

(8) The solid-state image pickup unit according to (7), in which
the insulating layer is configured of a laminate structure formed with use of different materials, and
a film configuring an upper layer portion of the laminate structure in the insulating layer is removed in the pixel region.

(9) The solid-state image pickup unit according to any one of (1) to (8), in which a circuit substrate including the drive circuit is bonded to the surface of the sensor substrate.

(10) A method of manufacturing a solid-state image pickup unit, the method including:
forming photoelectric conversion sections in an array in a pixel region provided to a sensor substrate;
forming a drive circuit on a surface opposed to a light reception surface for the photoelectric conversion sections of the sensor substrate;

forming a through hole via reaching the drive circuit from the light reception surface of the sensor substrate in a peripheral region located outside the pixel region; and forming a pad wiring line directly laminated on the through hole via on the light reception surface in the peripheral region.

(11) The method of manufacturing the solid-state image pickup unit according to (10), in which in the forming of the through hole via, after a wiring groove and a connection hole penetrating the sensor substrate from a bottom of the wiring groove and extending to the drive circuit are formed on the light reception surface side of the sensor substrate, a through hole via configured of an embedded wiring portion and a through hole via portion is formed by simultaneously filling in the wiring groove and the connection hole.

(12) The method of manufacturing the solid-state image pickup unit according to (10) or (11), in which in the formation of the pad wiring line, a light-shielding film having light reception openings corresponding to the photoelectric conversion sections and the pad wiring line are formed of a same layer.

(13) The method of manufacturing the solid-state image pickup unit according to any of (10) to (12), the method including:

after forming an insulating layer on the light reception surface before forming the through hole via, and then forming the through hole via penetrating the insulating layer and the sensor substrate, forming a stepwise structure in the insulating layer by selectively thinning a portion corresponding to the pixel region of the insulating layer to allow the portion to be thinner than a portion corresponding to the peripheral region of the insulating layer;

forming a pad wiring line directly laminated on the through hole via on an upper step portion of the insulating layer; and forming a light-shielding film having light-reception openings corresponding to the photoelectric conversion sections on a lower step portion of the insulating layer.

(14) The method of manufacturing the solid-state image pickup unit according to (13), wherein in the forming of the insulating layer, the insulating layer is formed as a laminate structure formed with use of different materials, and in the forming of the stepwise structure in the insulating layer, a film configuring an upper layer portion of the laminate structure in the insulating layer is selectively removed with respect to a film configuring a lower layer portion.

(15) An electronic apparatus including:

a sensor substrate having a pixel region in which photoelectric conversion sections are formed in an array;

a drive circuit provided on a surface opposed to a light reception surface for the photoelectric conversion sections of the sensor substrate;

a through hole via provided in a peripheral region located outside the pixel region to reach the drive circuit from the light reception surface of the sensor substrate;

a pad wiring line directly laminated on the through hole via on the light reception surface in the peripheral region; and an optical system configured to guide incident light to the photoelectric conversion sections.

(16) A solid-state image pickup unit including:

a sensor substrate having a pixel region in which photoelectric conversion sections are formed in an array;

a drive circuit provided on a surface opposed to a light reception surface for the photoelectric conversion sections of the sensor substrate;

a light-shielding film provided on the light reception surface in the pixel region and having light reception openings corresponding to the photoelectric conversion sections;

a protective insulating film provided to cover the light-shielding film; and a plurality of through hole vias embedded from the protective insulating film to the sensor substrate in a peripheral region located outside the pixel region and connected to the drive circuit.

(17) The solid-state image pickup unit according to (16), in which a wiring line embedded in the protective insulating film and formed integrally with the through hole vias is included.

(18) The solid-state image pickup unit according to (16) or (17), in which a pad opening allowing an electrode pad disposed in the drive circuit of the sensor substrate to be exposed is provided in the peripheral region to penetrate the sensor substrate from the light reception surface.

(19) The image pickup unit according to any one of (16) to (18), in which the protective insulating film is configured with use of a high refractive index film and a low refractive index film, the low refractive index film is provided on the light-shielding film, and the high refractive index film is provided on the low refractive index film to embed the light reception openings of the light-shielding film therein.

(20) The solid-state image pickup unit according to any one of (16) to (19), in which an on-chip lens is included, the on-chip lens provided above the light-shielding film in a position corresponding to each of the photoelectric conversion sections on the light reception surface.

(21) The solid-state image pickup unit according to any one of (16) to (20), in which a circuit substrate including a drive circuit is bonded to the surface of the sensor substrate.

(22) A method of manufacturing a solid-state image pickup unit, the method including:

forming photoelectric conversion sections in an array in a pixel region provided to a sensor substrate;

forming a drive circuit on a surface opposed to a light reception surface for the photoelectric conversion sections of the sensor substrate;

forming a light-shielding film on the light reception surface in the pixel region;

forming a protective insulating film covering the light-shielding film; and forming a plurality of through hole vias embedded from the protective insulating film to the sensor substrate in a peripheral region located outside the pixel region and connected to the drive circuit.

(23) The method of manufacturing the solid-state image pickup unit according to (22), in which in the forming of the through hole vias, a wiring groove and a plurality of connection holes penetrating the sensor substrate from a bottom of the wiring groove and extending to the drive circuit are formed on the protective insulating film side in the peripheral region, and the through hole vias and a wiring line connecting the through hole vias to one another are integrally formed by simultaneously filling the wiring groove and the connection holes with a conductive member.

(24) The method of manufacturing the solid-state image pickup unit according to claim 23, in which after forming the protective insulating film, a surface of the protective insulating film is planarized, and the wiring groove is formed in the planarized protective insulating film.

(24) An electronic apparatus including:
a sensor substrate having a pixel region in which photoelectric conversion sections are formed in an array;
a drive circuit provided on a surface opposed to a light reception surface for the photoelectric conversion sections of the sensor substrate;
a light-shielding film provided on the light reception surface in the pixel region and having light reception openings corresponding to the photoelectric conversion sections;
a protective insulating film provided to cover the light-shielding film;
a plurality of through hole vias embedded from the protective insulating film to the sensor substrate in a peripheral region located outside the pixel region and connected to the drive circuit; and
an optical system configured to guide incident light to the photoelectric conversion sections.

The present disclosure contains subject matter related to that disclosed in Japanese Priority Patent Application No. 2011-220310 filed in the Japan Patent Office on Oct. 4, 2011 and Japanese Priority Patent Application No. 2011-223613 filed in the Japan Patent Office on Oct. 11, 2011, the entire content of which is hereby incorporated by reference.

What is claimed is:

1. A solid-state image pickup unit comprising:
a sensor substrate having a pixel region in which photoelectric conversion sections are arranged in an array;
a circuit on a surface opposed to a light reception surface for the photoelectric conversion sections of the sensor substrate;
a through hole via in a peripheral region located outside the pixel region and extending to the circuit from the light reception surface of the sensor substrate;
a pad wiring line directly laminated on the through hole via on the light reception surface in the peripheral region; and
an insulating layer disposed adjacent to the through hole via and opposite the light-receiving surface from the pad wiring line,
wherein,
the insulating layer has a first thickness corresponding to the peripheral region and a second thickness corresponding to the pixel region,
the first thickness is different than the second thickness,
the pad wiring line is disposed above the first thickness of the insulating layer, and
a light reception opening is disposed above the second thickness of the insulating layer.

2. The solid-state image pickup unit according to claim 1, further comprising:
a protective film provided on the light reception surface to cover the pad wiring line;
an on-chip lens provided on the protective film; and
a pad opening provided to the protective film to expose the pad wiring line.

3. The solid-state image pickup unit according to claim 1, wherein a device is disposed in a position superimposed on the pad wiring line on the surface of the sensor substrate.

4. The solid-state image pickup unit according to claim 1, wherein
the through hole via includes an embedded wiring portion provided to the light reception surface of the sensor substrate and a through hole via portion formed integrally with the embedded wiring portion, and
the pad wiring line is directly laminated on the embedded wiring portion.

5. The solid-state image pickup unit according to claim 4, wherein the embedded wiring portion is embedded on the light reception surface of the sensor substrate.

6. The solid-state image pickup unit according to claim 1, wherein
a light-shielding film having light reception openings corresponding to the photoelectric conversion sections is provided on the light reception surface in the pixel region, and
the pad wiring line and the light-shielding film are configured of a same layer.

7. The solid-state image pickup unit according to claim 1, further comprising:
a light-shielding film having light reception openings corresponding to the photoelectric conversion sections, wherein the light-shielding film is provided on the second thickness, and wherein the pad wiring line is provided on the first thickness.

8. The solid-state image pickup unit according to claim 1, wherein
the insulating layer has a laminate structure formed with use of different materials, and
a film of an upper layer portion of the laminate structure is removed in the pixel region.

9. The solid-state image pickup unit according to claim 1, wherein a circuit substrate comprising a drive circuit is bonded to the surface of the sensor substrate.

10. The solid-state image pickup unit according to claim 1, wherein a light-receiving surface side of the second thickness is closer to the sensor substrate than a light-receiving surface side of the first thickness.

11. The solid-state image pickup unit according to claim 10, further comprising:
a protective film provided on the light reception surface to cover the pad wiring line; and
a pad opening provided to the protective film to expose the pad wiring line.

12. The solid-state image pickup unit according to claim 11, further comprising:
an on-chip lens provided on the protective film.

13. The solid-state image pickup unit according to claim 10, wherein a device is disposed in a position superimposed on the pad wiring line on the surface of the sensor substrate.

14. The solid-state image pickup unit according to claim 10, wherein
the through hole via includes an embedded wiring portion provided to the light reception surface of the sensor substrate and a through hole via portion formed integrally with the embedded wiring portion, and
the pad wiring line is directly laminated on the embedded wiring portion.

15. The solid-state image pickup unit according to claim 14, wherein the embedded wiring portion is embedded on the light reception surface of the sensor substrate.

16. The solid-state image pickup unit according to claim 10, wherein
a light-shielding film having light reception openings corresponding to the photoelectric conversion sections is provided on the light reception surface in the pixel region, and
the pad wiring line and the light-shielding film are configured of a same layer.

17. The solid-state image pickup unit according to claim 10, further comprising:

a light-shielding film having light reception openings corresponding to the photoelectric conversion sections, wherein the light-shielding film is provided on the second thickness, and the pad wiring line is provided on the first thickness.

18. The solid-state image pickup unit according to claim 10, wherein
the insulating layer has a laminate structure formed with use of different materials, and
a film of an upper layer portion of the laminate structure is removed in the pixel region.

19. The solid-state image pickup unit according to claim 10, wherein a circuit substrate comprising a drive circuit is bonded to the surface of the sensor substrate.

20. The solid-state image pickup unit according to claim 1, wherein a distance from the sensor substrate to a light-receiving surface side of the second thickness is less than a distance from the sensor substrate to a light-receiving surface side of the first thickness.

21. The solid-state image pickup unit according to claim 20, further comprising:
a protective film provided on the light reception surface to cover the pad wiring line; and
a pad opening provided to the protective film to expose the pad wiring line.

22. The solid-state image pickup unit according to claim 21, further comprising:
an on-chip lens provided on the protective film.

23. The solid-state image pickup unit according to claim 20, wherein a device is disposed in a position superimposed on the pad wiring line on the surface of the sensor substrate.

24. The solid-state image pickup unit according to claim 20, wherein
the through hole via includes an embedded wiring portion provided to the light reception surface of the sensor substrate and a through hole via portion formed integrally with the embedded wiring portion, and
the pad wiring line is directly laminated on the embedded wiring portion.

25. The solid-state image pickup unit according to claim 24, wherein the embedded wiring portion is embedded on the light reception surface of the sensor substrate.

26. The solid-state image pickup unit according to claim 20, wherein
a light-shielding film having light reception openings corresponding to the photoelectric conversion sections is provided on the light reception surface in the pixel region, and
the pad wiring line and the light-shielding film are configured of a same layer.

27. The solid-state image pickup unit according to claim 20, further comprising:
a light-shielding film having light reception openings corresponding to the photoelectric conversion sections, wherein the light-shielding film is provided on the second thickness, and the pad wiring line is provided on the first thickness.

28. The solid-state image pickup unit according to claim 20, wherein
the insulating layer has a laminate structure formed with use of different materials, and
a film of an upper layer portion of the laminate structure is removed in the pixel region.

29. The solid-state image pickup unit according to claim 20, wherein a circuit substrate comprising a drive circuit is bonded to the surface of the sensor substrate.

30. An electronic apparatus, comprising:
a solid-state image pickup unit comprising:
a sensor substrate having a pixel region in which photoelectric conversion sections are arranged in an array;
a circuit on a surface opposed to a light reception surface for the photoelectric conversion sections of the sensor substrate;
a through hole via in a peripheral region located outside the pixel region and extending to the circuit from the light reception surface of the sensor substrate;
a pad wiring line directly laminated on the through hole via on the light reception surface in the peripheral region; and
an insulating layer disposed adjacent to the through hole via and opposite the light-receiving surface from the pad wiring line,
wherein,
the insulating layer has a first thickness corresponding to the peripheral region and a second thickness corresponding to the pixel region,
the first thickness is different than the second thickness
the pad wiring line is disposed above the first thickness of the insulating layer, and
a light reception opening is disposed above the second thickness of the insulating layer.

* * * * *